US010830589B2

United States Patent
Krug et al.

(10) Patent No.: US 10,830,589 B2
(45) Date of Patent: Nov. 10, 2020

(54) MAGNETIC NANOPARTICLE-BASED GYROSCOPIC SENSOR

(71) Applicant: The Board of Trustees of Western Michigan University, Kalamazoo, MI (US)

(72) Inventors: Brian G. Krug, Ada, MI (US); Johnson A. Asumadu, Kalamazoo, MI (US)

(73) Assignee: The Board of Trustees of Western Michigan University, Kalamazoo, MI (US)

(*) Notice: Subject to any disclaimer, the term of this patent is extended or adjusted under 35 U.S.C. 154(b) by 181 days.

(21) Appl. No.: 16/258,881

(22) Filed: Jan. 28, 2019

(65) Prior Publication Data

US 2019/0170513 A1 Jun. 6, 2019

Related U.S. Application Data

(63) Continuation of application No. PCT/US2017/044439, filed on Jul. 28, 2017.
(Continued)

(51) Int. Cl.

| *G01C 19/24* | (2006.01) |
| *B82Y 30/00* | (2011.01) |
| *H01F 1/44* | (2006.01) |
| *G01C 19/00* | (2013.01) |
| *H01F 7/20* | (2006.01) |
| *G01D 5/20* | (2006.01) |
| *G01R 19/165* | (2006.01) |

(Continued)

(52) U.S. Cl.
CPC .............. *G01C 19/24* (2013.01); *B82Y 30/00* (2013.01); *G01C 19/00* (2013.01); *G01D 5/2066* (2013.01); *G01R 19/16547* (2013.01); *H01F 1/0045* (2013.01); *H01F 1/447* (2013.01); *H01F 7/20* (2013.01); *B82Y 25/00* (2013.01)

(58) Field of Classification Search
CPC ................................ G01C 19/24; B82Y 30/00
See application file for complete search history.

(56) References Cited

U.S. PATENT DOCUMENTS

| 1,192,468 A | 7/1916 | Shonnard |
| 2,966,803 A | 1/1961 | Johnston |

(Continued)

FOREIGN PATENT DOCUMENTS

| CN | 102502877 A | 6/2012 |
| DE | 2500321 A1 | 7/1976 |

(Continued)

OTHER PUBLICATIONS

Krug et al., "Magnetic Nanoparticle-Based Gyroscopic Sensor: A Review," IEEE Sensors Journal, vol. 15, No. 8, Aug. 2015 , pp. 4174-4177.
(Continued)

*Primary Examiner* — Jewel V Dowtin
(74) *Attorney, Agent, or Firm* — Price Heneveld LLP

(57) ABSTRACT

A gyroscopic detection system utilizes magnetic nanoparticles that are suspended in a solution and exposed to a rotating magnetic field. The nanoparticles experience angular deviation from their axes if an external force is applied to the system. Solution composition and oscillation frequency may be varied to optimize the gyroscopic feedback.

18 Claims, 28 Drawing Sheets

Related U.S. Application Data

(60) Provisional application No. 62/368,722, filed on Jul. 29, 2016.

(51) Int. Cl.
*H01F 1/00* (2006.01)
*B82Y 25/00* (2011.01)

(56) References Cited

U.S. PATENT DOCUMENTS

| | | | |
|---|---|---|---|
| 2,971,384 A | 2/1961 | Johnston | |
| 2,980,363 A | 4/1961 | Schonstedt | |
| 2,995,939 A | 8/1961 | Munk | |
| 3,048,043 A | 8/1962 | Slater | |
| 3,071,977 A | 1/1963 | Bosch | |
| 3,103,623 A | 9/1963 | Greenwood, Jr. | |
| 3,210,395 A | 10/1965 | McDougall | |
| 3,214,982 A | 11/1965 | Sylvia | |
| 3,215,572 A | 11/1965 | Papell | |
| 3,236,108 A | 2/1966 | Zatsky et al. | |
| 3,417,041 A | 12/1968 | Brown et al. | |
| 3,451,289 A | 6/1969 | Edmonds et al. | |
| 3,469,922 A | 9/1969 | Coccoli et al. | |
| 3,656,013 A | 4/1972 | Hooper | |
| 3,721,497 A | 3/1973 | Shutt et al. | |
| 3,741,657 A | 6/1973 | Andringa | |
| 3,826,575 A | 7/1974 | Walter, Jr. | |
| 3,946,373 A | 3/1976 | Moolenbeek et al. | |
| 3,972,595 A | 8/1976 | Romankiw et al. | |
| 4,035,081 A | 7/1977 | Sepp et al. | |
| 4,101,435 A | 7/1978 | Hasegawa et al. | |
| 4,190,364 A | 2/1980 | Ljung et al. | |
| 4,196,365 A | 4/1980 | Presley | |
| 4,252,605 A | 2/1981 | Schaffer | |
| 4,257,015 A | 3/1981 | Ljung | |
| 4,309,107 A | 1/1982 | McNair et al. | |
| 4,329,241 A | 5/1982 | Massart | |
| 4,576,725 A * | 3/1986 | Miura | B22F 1/0022 252/62.51 R |
| 4,651,565 A | 3/1987 | Keene | |
| 4,751,486 A | 6/1988 | Minato | |
| 4,793,908 A | 12/1988 | Scott | |
| 4,856,878 A | 8/1989 | Wilson et al. | |
| 4,931,760 A | 6/1990 | Yamaguchi et al. | |
| 4,969,157 A | 11/1990 | Malvern | |
| 5,046,721 A | 9/1991 | Altare | |
| 5,058,571 A | 10/1991 | Hall | |
| 5,085,501 A | 2/1992 | Sakuma et al. | |
| 5,118,190 A | 6/1992 | Jurga et al. | |
| 5,136,668 A | 8/1992 | Malvern | |
| 5,331,403 A | 7/1994 | Rosker et al. | |
| 5,342,244 A | 8/1994 | Nelson | |
| 5,349,855 A | 9/1994 | Bernstein et al. | |
| 5,351,900 A | 10/1994 | Torney | |
| 5,406,847 A | 4/1995 | Rowe et al. | |
| 5,423,915 A | 6/1995 | Murata et al. | |
| 5,463,256 A | 10/1995 | Wang et al. | |
| 5,493,623 A | 2/1996 | Frische et al. | |
| 5,546,482 A | 8/1996 | Cordova et al. | |
| 5,780,739 A | 7/1998 | Kang et al. | |
| 5,781,301 A | 7/1998 | Ruffin | |
| 5,898,071 A | 4/1999 | Hawkins | |
| 5,969,816 A | 10/1999 | Kim et al. | |
| 5,995,710 A | 11/1999 | Holling et al. | |
| 6,198,094 B1 | 3/2001 | Freier et al. | |
| 6,201,331 B1 | 3/2001 | Nakano | |
| 6,233,374 B1 | 5/2001 | Ogle et al. | |
| 6,271,614 B1 | 8/2001 | Arnold | |
| 6,376,960 B1 | 4/2002 | Milet et al. | |
| 6,481,285 B1 | 11/2002 | Shkel et al. | |
| 6,514,481 B1 | 2/2003 | Prasad et al. | |
| 6,664,786 B2 | 12/2003 | Kretschmann et al. | |
| 6,676,729 B2 | 1/2004 | Sun | |
| 6,830,694 B2 | 12/2004 | Schiestel et al. | |
| 6,862,890 B2 | 3/2005 | Williams, III et al. | |
| 6,884,436 B2 | 4/2005 | Kipp et al. | |
| 6,979,979 B2 | 12/2005 | Xu et al. | |
| 7,029,514 B1 | 4/2006 | Yang et al. | |
| 7,040,163 B2 | 5/2006 | Shcheglov et al. | |
| 7,043,985 B2 | 5/2006 | Ayazi et al. | |
| 7,043,987 B2 | 5/2006 | Jeong et al. | |
| 7,235,119 B2 | 6/2007 | Sane et al. | |
| 7,253,119 B2 | 8/2007 | Dutta | |
| 7,281,425 B2 | 10/2007 | Chikovani et al. | |
| 7,281,426 B1 | 10/2007 | Chikovani et al. | |
| 7,330,269 B2 | 2/2008 | Zurn et al. | |
| 7,359,059 B2 | 4/2008 | Lust et al. | |
| 7,374,893 B2 | 5/2008 | Belcher et al. | |
| 7,380,722 B2 | 6/2008 | Harley et al. | |
| 7,425,749 B2 | 9/2008 | Hartzell et al. | |
| 7,433,735 B2 | 10/2008 | Dowling | |
| 7,458,335 B1 | 12/2008 | Bjorkman | |
| 7,470,840 B2 | 12/2008 | Emrick et al. | |
| 7,504,082 B2 | 3/2009 | Cho et al. | |
| 7,508,189 B2 | 3/2009 | Berkcan et al. | |
| 7,535,229 B2 | 5/2009 | Schlueter et al. | |
| 7,537,803 B2 | 5/2009 | Wang et al. | |
| 7,581,443 B2 | 9/2009 | Kubena et al. | |
| 7,691,285 B2 | 4/2010 | Teller et al. | |
| 7,818,871 B2 | 10/2010 | Shcheglov | |
| 7,838,208 B2 | 11/2010 | Yellen et al. | |
| 7,875,654 B2 | 1/2011 | Hong et al. | |
| 7,887,880 B2 | 2/2011 | Zhao et al. | |
| 8,003,079 B2 | 8/2011 | Margel et al. | |
| 8,066,969 B2 | 11/2011 | Cheon et al. | |
| 8,073,094 B2 | 12/2011 | Haramein | |
| 8,097,742 B2 | 1/2012 | Ying et al. | |
| 8,104,358 B1 | 1/2012 | Jia et al. | |
| 8,166,816 B2 | 5/2012 | Ayazi et al. | |
| 8,193,804 B2 | 6/2012 | Hong et al. | |
| 8,251,885 B2 | 8/2012 | Ueda et al. | |
| 8,333,993 B1 | 12/2012 | Perez et al. | |
| 8,470,203 B2 | 6/2013 | Kaner et al. | |
| 8,528,404 B2 | 9/2013 | Ayazi | |
| 8,614,742 B2 | 12/2013 | Stowe et al. | |
| 8,615,113 B2 | 12/2013 | Lee et al. | |
| 8,624,584 B2 | 1/2014 | Krozer et al. | |
| 8,648,433 B2 | 2/2014 | Pinter | |
| 8,666,738 B2 | 3/2014 | Moeller | |
| 8,688,229 B2 | 4/2014 | Feucht et al. | |
| 8,715,150 B2 | 5/2014 | Creighton | |
| 8,722,091 B2 | 5/2014 | Brynjelsen et al. | |
| 8,789,416 B2 | 7/2014 | Rocchi | |
| 8,808,567 B2 | 8/2014 | Mazyar et al. | |
| 8,889,429 B2 | 11/2014 | Cao et al. | |
| 8,980,218 B2 | 3/2015 | Russo et al. | |
| 9,032,795 B2 | 5/2015 | Lim et al. | |
| 9,095,855 B2 | 8/2015 | Lee | |
| 9,329,039 B2 | 5/2016 | Agafonov et al. | |
| 2001/0030752 A1 | 10/2001 | Scruggs et al. | |
| 2002/0148308 A1 | 10/2002 | Rush | |
| 2002/0189350 A1 | 12/2002 | Tu | |
| 2003/0203187 A1 | 10/2003 | Ray et al. | |
| 2004/0231462 A1* | 11/2004 | Shiraishi | G11B 5/70605 75/348 |
| 2005/0113489 A1 | 5/2005 | Baran, Jr. et al. | |
| 2006/0010978 A1 | 1/2006 | Lee et al. | |
| 2006/0019096 A1 | 1/2006 | Hatton et al. | |
| 2007/0057581 A1 | 3/2007 | Miner | |
| 2007/0111331 A1 | 5/2007 | Hong et al. | |
| 2007/0197953 A1 | 8/2007 | Slade et al. | |
| 2008/0007421 A1 | 1/2008 | Liu et al. | |
| 2008/0122431 A1 | 5/2008 | Berkcan et al. | |
| 2010/0203088 A1 | 8/2010 | Sanjeev et al. | |
| 2010/0259259 A1 | 10/2010 | Zahn et al. | |
| 2011/0104073 A1 | 5/2011 | Zeng et al. | |
| 2011/0226990 A1 | 9/2011 | Glennon et al. | |
| 2012/0070858 A1 | 3/2012 | Contreras et al. | |
| 2012/0241693 A1 | 9/2012 | Magdassi et al. | |
| 2012/0259572 A1 | 10/2012 | Afzal et al. | |
| 2012/0302407 A1 | 11/2012 | Kelliher | |
| 2012/0308657 A1 | 12/2012 | Dravid et al. | |
| 2013/0075649 A1 | 3/2013 | Wang | |
| 2013/0289383 A1 | 10/2013 | Flynn et al. | |

(56) References Cited

U.S. PATENT DOCUMENTS

| | | | |
|---|---|---|---|
| 2014/0026660 A1 | 1/2014 | Zhang et al. | |
| 2014/0124698 A1 | 5/2014 | Suh et al. | |
| 2014/0161730 A1 | 6/2014 | Sitharaman et al. | |
| 2014/0234142 A1 | 8/2014 | Mischiatti et al. | |
| 2014/0260614 A1 | 9/2014 | Bhave et al. | |
| 2015/0033853 A1 | 2/2015 | Zhang et al. | |
| 2016/0154020 A1 | 6/2016 | Zhang et al. | |
| 2018/0130583 A1* | 5/2018 | Liang | H01F 1/447 |
| 2019/0170513 A1* | 6/2019 | Krug | H01F 1/0045 |

FOREIGN PATENT DOCUMENTS

| | | |
|---|---|---|
| EP | 0315717 A1 | 5/1989 |
| EP | 0349961 A1 | 1/1990 |
| EP | 0480442 A1 | 4/1992 |
| EP | 1347747 B1 | 3/2006 |
| EP | 1780506 A2 | 5/2007 |
| EP | 1790977 A1 | 5/2007 |
| EP | 2696169 A2 | 2/2014 |

OTHER PUBLICATIONS

Krug et al., "Orientation and Inertia Sensory Feedback Feasibility Using Spinning Magnetic Nanoparticles," IEEE 2016, Western Michigan University, Electrical and Computer Engineering, Kalamazoo, Michigan (4 pages).

Forman et al., "A Magnetic Induction Gyroscope," IEEE Transactions on Military Electronics, Jan. 1963, pp. 40-44, Republic Aviation Corporation, Farmingdale, N.Y., (5 pages).

Bernstein, "An Overview of MEMS Inertial Sensing Technology," Sensors Online, Feb. 1, 2003 (9 pages).

Semat et al., "Physics, Chapter 29: The Magnetic Field," Robert Katz Publications, Research Papers in Physics and Astronomy, Jan. 1958, Lincoln, Nebraska (19 pages).

Shiner, "How Things Work: Ring Laser Gyros," Air & Space Magazine, Sep. 2002 (2 pages).

Zahn, "Magnetic fluid and nanoparticle applications to nanotechnology," Journal of Nanoparticle Research 3: 73-78, Nov. 1, 2000, Cambridge MA (6 pages).

Gilder et al., "Magnetic properties of single and multi-domain magnetite under pressures from 0 to 6 GPA," Geophysical Research Letters, vol. 31, L10612, May 26, 2004 (5 pages).

Blaney, "Magnetite (Fe304): Properties, Synthesis, and Applications," Lehigh University, Lehigh Preserve, vol. 15—2007, paper 5 (50 pages).

Cantillon-Murphy et al., "Simulating Magnetic Nanoparticle Behavior in Low-field MRI under Transverse Rotating Fields and Imposed Fluid Flow," NIH Public Access, Author Manuscript, Sep. 1, 2011 (27 pages).

Reeves et al., "Simulations of magnetic nanoparticle Brownian motion," Department of Physics and Astronomy, Dartmouth College, Hanover, NH, Journal of Applied Physics, Dec. 2012 (6 pages).

Janssen et al., "Controlled torque on superparamagnetic beads for functional biosensors," Biosensors and Bioelectronics 24 (2009) pp. 1937-1941, Jun. 24, 2008 (5 pages).

Dieckhoff, et al., "Fluxgate based detection of magnetic nanoparticle dynamics in a rotating magnetic field," Applied Physics Letters 99, 112501 (2011) AIP Publishing, Sep. 14, 2011 (4 pages).

Dieckhoff et al., "Homogenous Bioassays Based on the Manipulation of Magnetic Nanoparticles by Rotating and Alternating Magnetic Fields—A Comparision," IEEE Transactions on Magnetics, vol. 48, No. 11, Nov. 2012, pp. 3792-3795.

Enpuku et al., "Magnetic fluid dynamics in a rotating magnetic field," Journal of Applied Physics 111, 053901 (2012), AIP Publishing, Mar. 1, 2012 (11 pages).

Dieckhoff et al., "Magnetic marker based homogenous bioassays utilizing rotating magnetic fields," Journal of Applied Physics 115, 17B304 (2014), AIP Publishing, Jan. 27, 2014 (4 pages).

Niemirowicz et al., "Magnetic nanoparticles as new diagnostic tools in medicine," Advances in Medical Sciences—vol. 57 (2) 2012, pp. 196-207, May 29, 2012 (12 pages).

Duguet et al., "Magnetic nanoparticles and their applications in medicine," 2006 Future Medicine Ltd ISSN 1743-5889, pp. 157-168.

Borochin, "How a new generation of highly integrated MEMS sensors opens up new possibilities for the application of motion sensing and location tracking," Future Technology Magazine, Jul. 2014 (2 pages).

Ranzoni, et al., "Magnetically controlled rotation and torque of uniaxial microactuators for lab-on-a-chip applications," Lab on a Chip, The Royal Society of Chemistry 2010, Nov. 16, 2009, pp. 179-188 (10 pages).

Jansen et al., "On-chip manipulation and detection of magnetic particles for functional biosensors," Biosensors and Bioelectronics 23 (2008), Science Direct, Sep. 6, 2007, pp. 833-838 (6 pages).

Potter et al., "Single-Domain Particles in Rocks and Magnetic Fabric Analysis," Geophysical Research Letters, vol. 15, No. 10, pp. 1097-1100, Sep. 1988.

Krug, "Sensing Gyroscopic Properties of Rotating Magnetic Nanoparticles in Solution," Scholarworks at WMU, Western Michigan University, Dissertations, Paper 1612, Jun. 2016 (110 pages).

International Search Report and the Written Opinion of the International Searching Authority, PCT Application No. PCT/US2017/044439, dated Nov. 16, 2017 (8 pages).

* cited by examiner

MAGNETIC NANOPARTICLE-BASED GYROSCOPIC SENSOR

CROSS-REFERENCE TO RELATED APPLICATIONS

This application is a Continuation of PCT Application No. PCT/US2017/044439, filed on Jul. 28, 2017, which claims priority under 35 U.S.C. § 119(e) to U.S. Provisional Application No. 62/368,722, filed on Jul. 29, 2016, entitled "MAGNETIC NANOPARTICLE-BASED GYROSCOPIC SENSOR," the entire disclosures of which are hereby incorporated herein by reference.

BACKGROUND OF THE INVENTION

Magnetic nanoparticles may be utilized in a variety of technologies. For example, magnetic nanoparticles may be used to guide medicine in patients where specifically needed in the body, and to reduce damage in other areas. Magnetic nanoparticles may be spun to increase local temperatures to also help destroy dangerous cells as a treatment option.

Nano-sized materials typically have particles of less than 100 nanometer (nm). Various processes and systems for making magnetic nano-size materials and particles are known. For example, thermal technologies and techniques have been employed to produce magnetic ultra- and nano-size magnetic particles. The materials are heated into gaseous state in order to obtain the magnetic ultra- and nano-size materials. Chemical processes may also be utilized to produce materials having nano-size particles. Various liquid phase methodologies for producing nano-size particles are known. Known mechanical and polishing technologies may also be utilized to produce nano-size particles. Magnetic nanoparticles have been produced using various know processes. Such particles have been used in medical applications, printing, biosensors, heating, etc.

Conventional smaller magnetic nanoparticles (approximately 10 nms in diameter) in solution maintain their relative position and orientation even in gravity due to Brownian relaxation. Random motion and collisions keep the magnetic nanoparticles distributed and prevents settling. Magnetic nanoparticles generally have particle sizes that are less than about 100 nm in diameter. Magnetic nanaoparticles have magnetic moments which cause the magnetic nanoparticles to relax when dissolved in aqueous solutions and fluids. Water, organic and inorganic solvents, etc. have been used as a medium to suspend magnetic nanoparticles. In most applications the magnetic nanoparticles are prevented from agglomeration and sedimentation. The relaxation and suspension times are typically strongly size-dependent.

BRIEF SUMMARY OF THE INVENTION

The present disclosure relates to a method and a system that includes magnetic nanoparticles that are disposed in a magnetic rotating field. In one aspect, the nanoparticles act as a plurality of miniature "gyroscopes." It will be understood that the meaning of the term "gyroscope" as used herein is not necessarily the same as the meaning applied to conventional gyroscopes. The overall effect of the particles (miniature gyroscopes) is combined as a single gyroscope. Coils carry electrical current to generate a rotating magnetic field having the same frequency as the electrical current in the coils. Magnetic nanoparticles are disposed in a solvent and rotate at the same frequency as the current. A sensing circuit or other suitable device converts precession rotation and spin of magnetic nanoparticles into an electric signal. The rotating magnetic field producing circuit includes one or more coils, magnetic core material, and solvents. The magnetic core may be formed into a plurality of shapes and contain solvent therein. The sensing circuit may include precision current probes connected to one or more precision current transducers. The present disclosure includes gyroscopic devices and apparatus that may be used for the precession of magnetic nanoparticles for efficiency with precision. Devices according to the present disclosure are preferably simple to fabricate, resistant to shock and damage, produce little noise, and have good immunity from external electromagnetic fields. Devices according to the present disclosure are also flexible in size and shape, have very low environmental impact, and energy cost savings. Gyroscopic sensors according to the present disclosure may be utilized in spacecraft, aircraft, and other applications.

The present disclosure provides a system and method of spinning magnetic nanoparticles of approximately less than 10 nm in size and single phase, suspended in solution, with rotating magnetic field produced by one or more coils wrapped around a magnetic core material container. The coils may be orientated wound at different angles (phases) relative to each other.

The system/process of the present disclosure also includes a relatively constant rotating magnetic field in a container with alternate currents ("AC") of different phase that are applied to the coils. Although the container may cause some disturbances in the magnetic field, the general result is a rotating magnetic field. The frequency of the AC current determines the rate of rotation of the particles at lower frequency. The magnetic nanoparticles in the solution are ideally spun in place by applying the rotating magnetic field to the solution. Brownian motion keeps the particles from settling due to gravity. Each magnetic nanoparticle spins on its individual axis in its confined area.

Movement of the sensor (e.g. rotation, pitching, angular acceleration, angular velocity, etc.) tends to shift the rotational axes of the magnetic nanoparticles. This shifting is a precession at right angles to the axis of the rotating magnetic field and the axes of rotation of the nanoparticles. However, the rotating magnetic field generates a force tending to prevent precession and hold the axis particle at a constant orientation relative to the sensor's axis to prevent precession. Changes in the rotating magnetic strength are seen (detected) as changes in the input current of the sensor. The input current of the sensor returns to its steady-state when the precession ends. The greater or quicker the rotation, the greater the changes in the input current of the sensor.

During operation, a gyroscopic sensor according to the present disclosure utilizes magnetic nanoparticles spinning in equilibrium. If the senor experiences a disturbance that changes the orientation of the sensor, the magnetic nanoparticles "respond" by attempting to maintain their previous spinning orientation, which is shifted relative to the rotating magnetic field direction due to the change in orientation of the sensor. The input electrical current to the sensor initially decreases due to the loss of magnetic nanoparticle spin torque due to the misalignment (precision) of the rotational axis of the nanoparticles relative to the axis of rotation of the magnetic field. The electrical current increases as the axis of rotation of the magnetic nanoparticles realign to the new magnetic field direction, requiring a new startup torque until equilibrium is regained.

In general, each nanoparticle acts somewhat similar to a simple gyroscope. Thus, any "wobble" due to precession is negated. Also, similar to a gimbal, the rotating magnetic field keeps the axis of each magnetic nanoparticle locked. The AC electrical currents keep the magnetic nanoparticles from drifting together toward the wires or to the magnetic sources. The magnetic nanoparticles align with the individual magnetic axis with the rotating magnetic field direction, which is constantly rotating. Each magnetic nanoparticle contributes an individual resistance to the change in orientation. Thus, the total resistance increases if more particles are present in the solution. Greater total resistance may provide increased accuracy.

A magnetic nanoparticle-based gyroscopic sensor according to the present disclosure may be fabricated by mixing a ferrous material in powder form in a magnetically inert fluid (at the proper concentration). The liquid solution is disposed in a container, and the container is surrounded by a plurality of coils of wire.

The individual component of a nanoparticle contribution to the sensor system may be integrated by many orders of magnitude, and more energy may be needed to realign all of the nanoparticles, provided nanoparticle-to-nanoparticle interaction is minimized. The nanoparticles may act as a multitude of miniature gyroscopes, whose overall effect can be combined as a single gyroscope. The gyroscopic sensor system may optionally include control means (e.g. a controller) configured to decouple the sensor system from a multiphase alternating current (AC) power supply source in response to a sensed current level exceeding (or below) a predetermined threshold and/or control means (e.g. a controller) configured to decouple the sensor system from a multiphase AC power supply source in response to a sensed voltage level below or exceeding a predetermined threshold. The system may optionally include a controller configured to utilize a control voltage indicating the highest sensed current. The control voltage may be compared to the predetermined threshold.

These and other embodiments, features and advantages of the present invention will become apparent from the following detailed descriptions in addition to the accompanying drawings.

DETAILED DESCRIPTION

Figure 2:
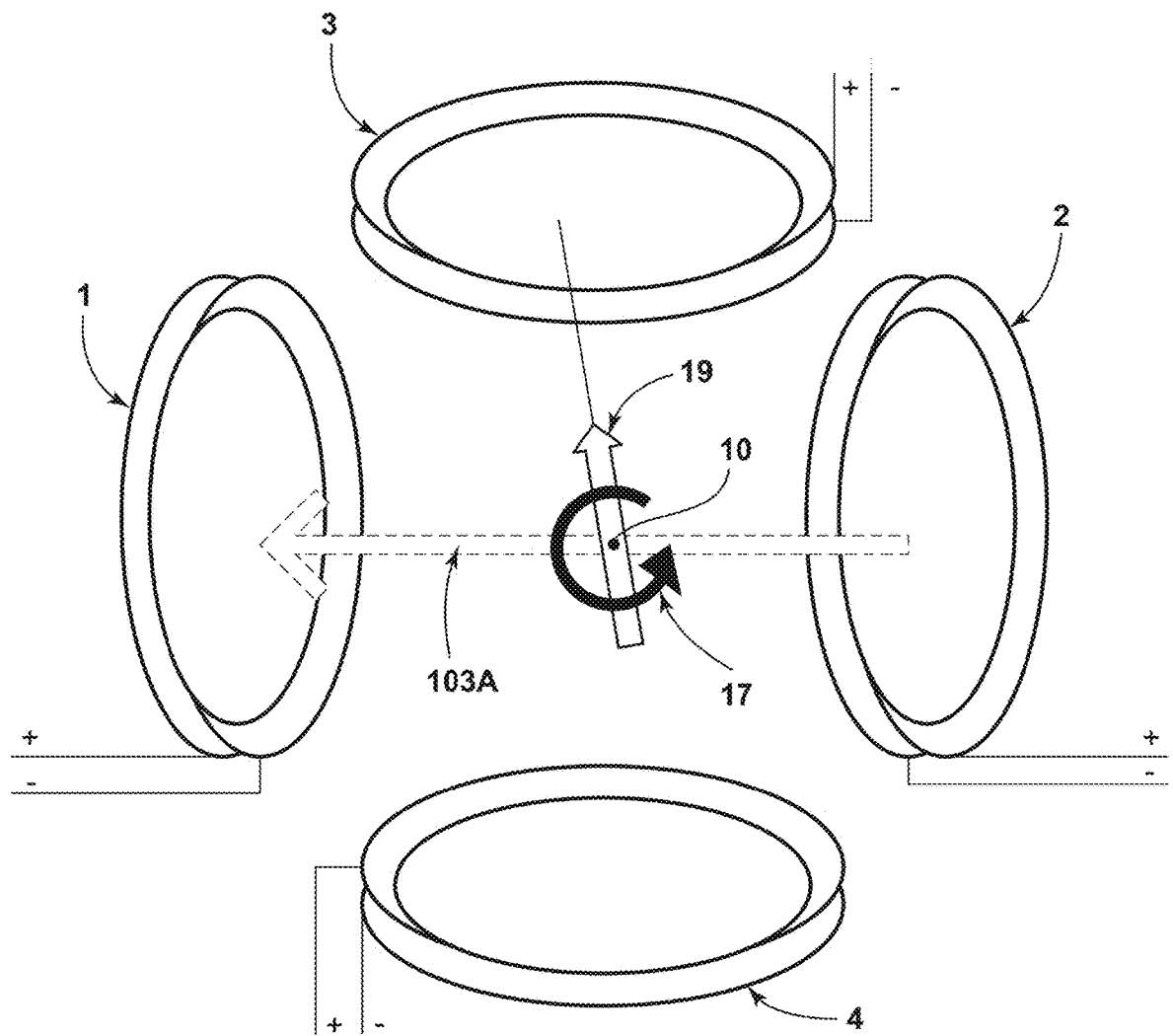
FIG. 2 is a schematic isometric view showing four alternating Helmholtz coils that are configured to generate rotating magnetic fields that create a field vector to which the magnetic nanoparticle's moment is constantly aligned to, or is slightly lagging.

For purposes of description herein, the terms "upper," "lower," "right," "left," "rear," "front," "vertical," "horizontal," and derivatives thereof shall relate to the invention as oriented in FIG. 2. However, it is to be understood that the invention may assume various alternative orientations and step sequences, except where expressly specified to the contrary. It is also to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

Physical orientation of an object in space can be derived by measuring energy changes in the object's angular momentum when force is exerted on it. The force may be due to acceleration or gravity. The energy may be in the form of electrical current. An electric current generates a magnetic field as shown by Oersted in 1819. By alternating the electric current, an oscillating magnetic field results. If a second alternating field is added and shifted properly, a rotating magnetic field can be created. As discussed in more detail below, magnetic nanoparticles in solution can be encased in this rotating magnetic field, resulting in rotating magnetized nanoparticles. Because the rotating magnetized nanoparticles act somewhat similar to miniature gyroscopes, certain properties of gyroscopes can be exploited. A main property of interest is precession. Precession adds resistance to the magnetic field, which can be measured as a change in input current.

Various properties of the detection system may be optimized. As discussed below, these properties include fluid type, current magnitude and oscillation frequency. Size of the magnetic nanoparticle, temperature, and nanoparticle concentration may also be optimized. In the examples discussed below, the fluids are limited to water and toluene as these are readily available with controlled nanoparticles in solution. However, it will be understood that the present invention is not limited to these specific fluids.

Magnetic fields can be used to control the orientation of magnetic nanoparticles in solution. The behavior of magnetic particles in solution may be caused by the Ne'el relaxation process or by the Brownian process. The relaxation is due to the physical rotation of the nanoparticles or the Brownian motion of the magnetic nanoparticles within the solution. The relaxation of the magnetic particles in solution is due to the rotation of the magnetic moments of the magnetic nanoparticles themselves. For magnetic nanoparticles of less than about 4 nm in diameter, Ne'el relaxation dominates where the internal magnetic moment relaxation or recovery time dominates. If the magnetic nanoparticles are greater than about 4 nm in diameter, Brownian motion dominates. In the magnetic field, the Brownian motion results from the torque exerted on the magnetic nanoparticle. The torque is proportional to the magnetic moment of the magnetic nanoparticles. In Ne'el relaxation, the magnetic field results in variation of energy. In this case, the rotation of magnetic nanoparticles in fluid dominates the phase lag time. Rotating and controlling a magnetic field may present challenges when dealing with magnetic nanoparticles. In a rotating magnetic field the polarities of the magnet field rotate about a central axis. Rotating magnetic fields have been utilized in various known devices. Various types of gyroscopes have been developed. For example, micro-machined and "inertia" micro-electromechanical systems (MEMs) technologies have been used in inertia gyroscopic sensors. Fiber optic and laser gyroscopes have also been developed.

As a gyroscope rotates, it will maintain its orientation until an external force attempts to topple it. This force is translated to a motion perpendicular to the force applied and results in precession. The gyroscope appears to wobble. Removing this force will remove the "wobble." The magnetic nanoparticle based gyroscopic detection system of the present disclosure utilizes this principle. Each magnetic nanoparticle of the magnetic nanoparticle based gyroscopic detection system is suspended in a fluid. The particles are small enough (on the order of tens of nanometers) so that Brownian motion keeps the particles from settling. All magnetic nanoparticles are exposed to a rapidly rotating magnetic field. If the magnetic axis of the magnetic nanoparticle based gyroscopic detection system is aligned with the force of gravity, the orientation of the magnetic particle will be maintained and the overall system energy (energy to maintain the particle rotation) remains unchanged.

If an external force is applied, the particles begin to precess. An external force may result from acceleration or tilting of the sensor to vary the angle of the force of gravity. At the same time, the magnetic field that was imposed to rotate the particles is now also exposed to the same force of either acceleration or gravity. The field will cause a force tending to realign the particles to the magnetic rotational axis, resulting in a change in the energy imposed in the system. This energy is supplied in the form of electrical current. Although the changes in electrical current may be relatively small, the changes can be measured and utilized for sensing applications. The magnetic nanoparticle based gyroscopic detection system used in the experiments discussed below is approximately 2 centimeters×2 centimeters×1 centimeter. It can be shown that the change in magnetic field B is inversely proportional to the sine of the angle of precession.

FIGS. 1-14 generally show a sensor according to the present disclosure. As discussed in more detail below, the sensor includes rotating magnetic nanoparticles ("nanoparticles") in a ferrofluid solution, and coils that carry AC electrical current to generate a rotating magnetic field acting on the nanoparticles. Changes in the orientation of the sensor cause changes in the electrical current of the coils. The changes in the electrical current can be measured, and the changes can be utilized to calculate changes in the orientation of the sensor.

Figure 1:
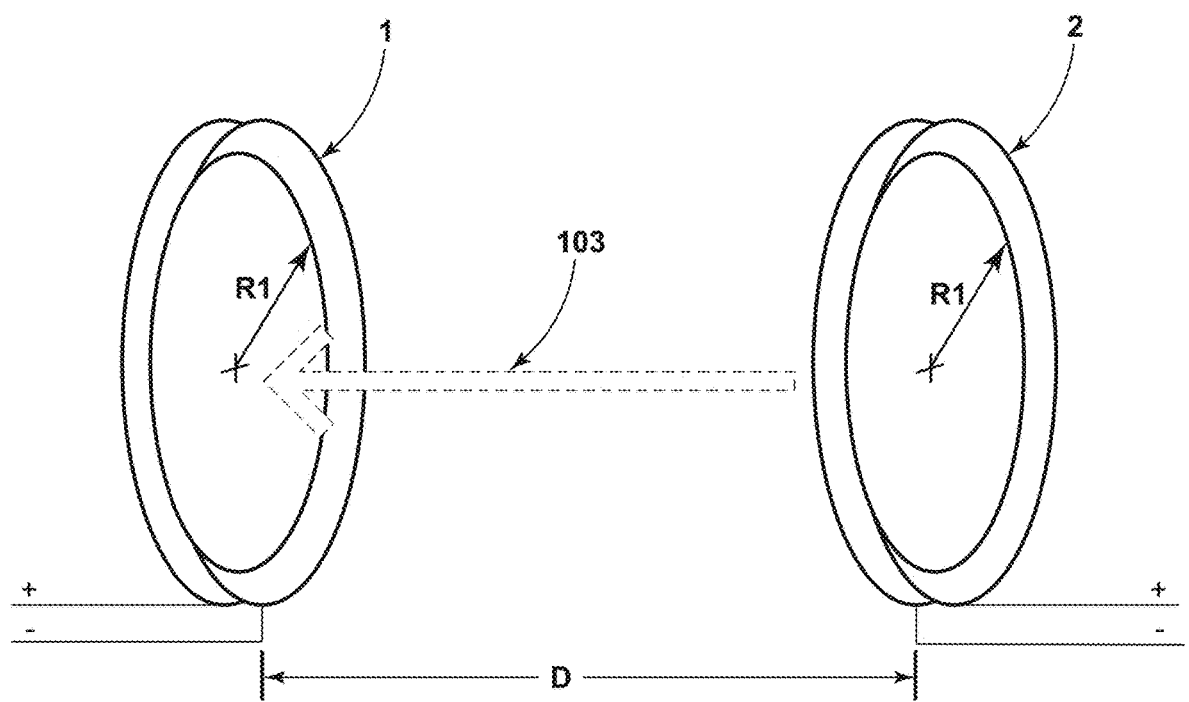
FIG. 1 is a schematic isometric view showing two alternating Helmholtz coils that are configured to generate uniform magnetic field, where currents in the coils produce fields at either 0° or 180° alignment, resulting in push-pull force as the magnetic nanoparticles transition between the two angles.

Referring to FIG. 1, first and second alternating Helmholtz coils 1 and 2, respectively, may be utilized to generate an alternating magnetic field. The coils 1 and 2 preferably have equal radii R1 and R2. Coils 1 and 2 may be separated by a distance "D" that is equal to the radius of the coils 1 and 2. Coils 1 and 2 produce a uniform directional magnetic field 103 between and inside the coils 1 and 2. Alternating nanoparticles have only one of two vectors, similar to the poles of a stationary magnet. As discussed in more detail below, the electrical currents in the coils 1 and 2 is controlled to produce fields at either 0° or 180° alignment, resulting in a push-pull force on the nanoparticles as the nanoparticles transition to angles between the two angles.

The magnetic moment of a nanoparticle that is rotated in a magnetic field is constantly aligned with (or lags slightly) the field vector of the electric field. The direction of the nanoparticle is constantly controlled while the nanoparticle rotates. It will be understood that this is somewhat similar to the operation of an AC induction motor.

With further reference to FIG. 2, the sensor preferably includes a minimum of two sets of two Helmholtz coils, providing a total of four coils 1, 2, 3, and 4. The coils 1-4 may be configured such that coils 3 and 4 form a first pair, and coils 1 and 2 may form a second pair. The sets of Helmholtz coils 1-4 are supplied with electric currents that are 90° out of phase. Utilizing two pairs of Helmholtz coils produces a rotating uniform directional magnetic field 103A. The coils 1-4 are configured to create a smoothly rotating magnetic field (i.e. uniform strength and constant rate of rotation). This produces smooth rotation as desired for proper gyroscopic motion. The spin path of each magnetic nanoparticle 10 is shown by arrow 17. As shown in FIG. 2, the magnetic moment 18 of each magnetic nanoparticle 10 is constantly aligned to, or is slightly lagging. Although a single nanoparticle 10 is shown in FIG. 2, it will be understood that a sensor according to the present disclosure may include a very large number of nanoparticles 10.

Figure 3A:
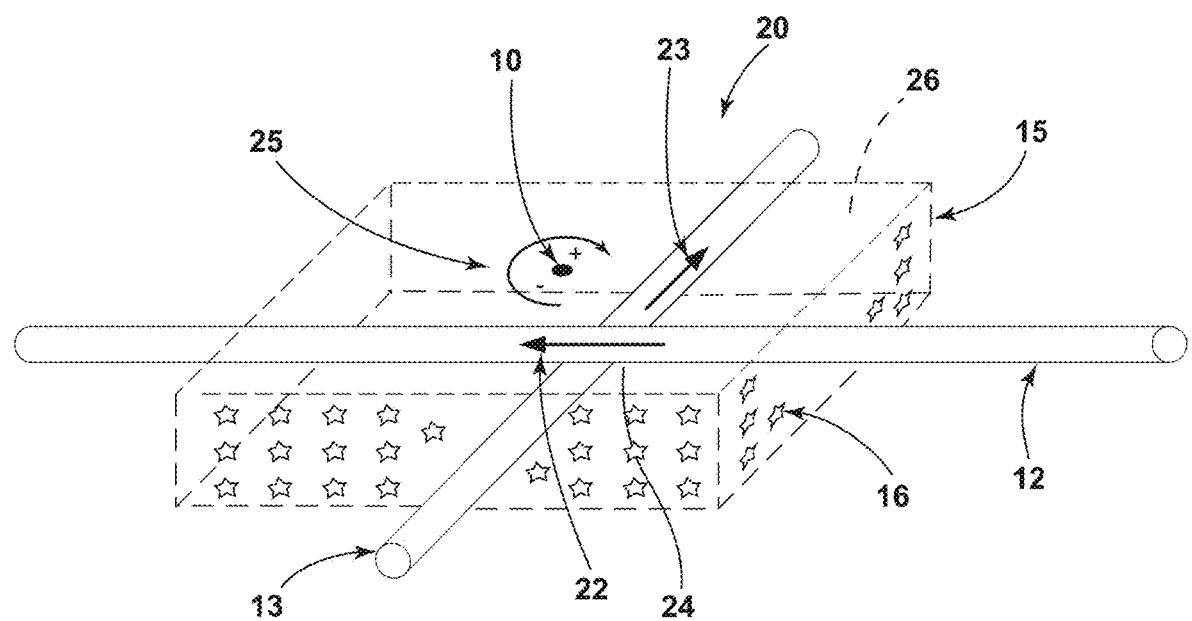
FIG. 3A is a schematic isometric view showing two crossing conductors (e.g. wires) that are transverse (perpendicular) to each other and carry electrical currents that are 90° out of phase, and showing a single rotating magnetic nanoparticle which is ideally suspended in place.

With further reference to FIG. 3A, sensor 20 may include first and second insulated conductors such as wires 12 and 13, respectively. Wires 12 and 13 are oriented perpendicular (transverse) to each other (90° apart in space) and cross at an intersection 24. A magnetic core container 15 includes a nanoparticle 10 that is suspended in a liquid solution 16. Solution 16 may comprise water, toluene, or other suitable liquid solutions. Brownian motion of solution 16 suspends one or more nanoparticles 10. Wires 12 and 13 carry alternating electrical currents 22 and 23, respectively, that are 90° out of phase. A single nanoparticle 10 is ideally suspended in place. This is a stable point as the rotating magnetic field 103, 103A tends to pull any magnetic object toward each wire 12, 13. As the electric currents 22, 23 in each wire 12, 13 approach zero during the AC current cycle, the nanoparticle 10 is aligned and attracted to the wire 12 or 13 in a conducting portion of the AC current cycle. This cycle repeats, resulting in a spinning path 25 of the nanoparticle 10, wherein the nanoparticle 10 is held in place above the intersection of wires 12 and 13. If more than one nanoparticle 10 is present, the nanoparticles 10 are pulled together at the center. To allow free movement of the nanoparticles 10, an insulating, low friction barrier (not shown) may be positioned between the nanoparticles 10 and the wires 12, 13. The low friction barrier may comprise a non-magnetic fluid in the container 15. However, the nanoparticles 10 are not completely free to spin in the fluid 16 because the nanoparticles 10 are drawn to wall 26 of the container 15 closest to the intersection 24 of the wires 12 and 13.

Figure 3B:
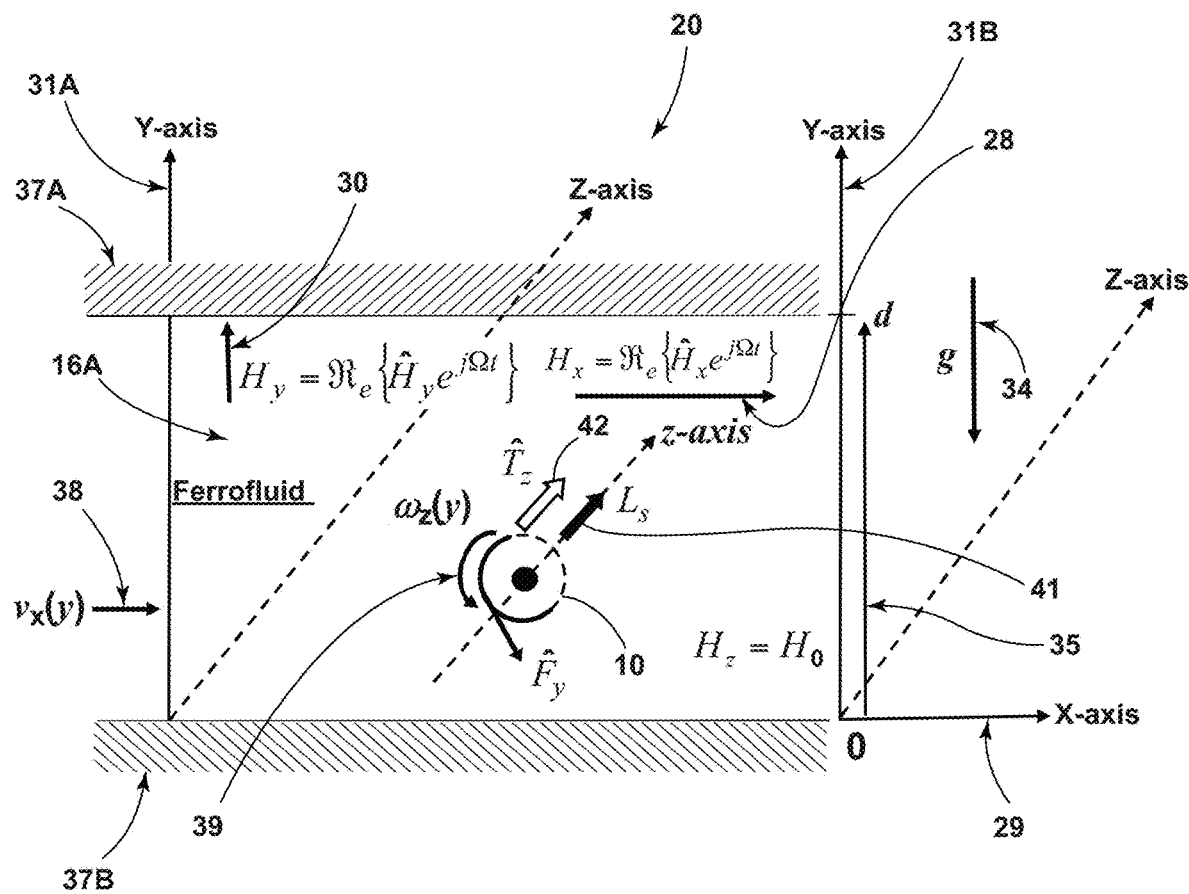
FIG. 3B is a schematic view of a nanoparticle in a ferrofluid, wherein the nanoparticle is spinning due to torque acting on the nanoparticle.

With further reference to FIG. 3B, a sensor 20 according to the present disclosure may include a plurality of magnetic nanoparticles 10 that are disposed in ferrofluid 16A. For clarity, the forces acting on a single nanoparticle 10 are shown in FIG. 3B. However, sensor 20 preferably includes a very large number of magnetic nanoparticles 10. A horizontal magnetic intensity component 28 extends parallel to horizontal X-axis 29, and a vertical magnetic intensity component 30 extends along (parallel to) vertical Y-axes 31A and 31B. Gravity g extends opposite the Y-axis 31B as shown by the arrow 34.

The horizontal X-axis magnetic intensity component 28 is expressed as:

$$H_x = \Re_e\{\hat{H}_x e^{j\Omega t}\} \quad (1.0)$$

In Equation 1.0, $\hat{H}_x$ is the X-axis component of the mean magnetic intensity of a rotating magnetic field, $\Omega$ is the angular velocity of the rotating magnetic field, $j=\sqrt{-1}$ and $\Re_e$ is the real part of $H_x$.

The Y-axis component 30 is expressed as:

$$H_y = \Re_e\{\hat{H}_y e^{j\Omega t}\} \quad (2.0)$$

In Equation 2.0, $\hat{H}_y$ is the Y-axis component of the mean magnetic intensity of the rotating magnetic field, $\Omega$ is the angular velocity of the rotating magnetic field, $j=\sqrt{-1}$, and $\Re_e$ is the real part of $H_y$.

In FIG. 3B, d is the distance 35 (arrow "d") between rigid stationary walls 37A and 37B of container 16A. The ferrofluid flow velocity $V_x(y)$ 38 is directed in the direction of the X-axis.

The ferrofluid magnetization equation advanced by Shliomis is:

$$\frac{\partial M}{\partial t} + (v \cdot \nabla)M - \omega \times M + \frac{(M - \chi_0 H)}{\tau} = 0 \quad (3.0)$$

Where M is the instantaneous fluid magnetization, v is the fluid linear flow velocity, $\omega$ is the magnetic spin angular velocity vector, $\tau$ is the magnetic fluid relaxation time constant, and $\chi_0$ is the magnetic susceptibility. The applied rotating magnetic field is uniform and the magnetization is independent of (constant) in the X-axis direction, but varies with (along) the Y-axis.

The second term of Equation 3.0 is zero because of the imposed linear flow, and Equation 3.0 becomes:

$$\frac{\partial M}{\partial t} + -\omega \times M + \frac{(M - \chi_0 H)}{\tau} = 0 \qquad (4.0)$$

In the absence of any applied pressure difference or imposed linear flow, the equation 4.0 solution for X-axis and Y-axis directed transverse magnetizing components are:

$$\hat{M}_x = \frac{\chi_0 \lfloor (j\Omega\tau + 1 + \chi_0)\hat{H}_x - \hat{B}_y \omega_z \tau / \mu_0 \rfloor}{[(\omega_z \tau)^2 + (j\Omega\tau + 1)(j\Omega\tau + 1 + \chi_0)]} \qquad (5.0)$$

$$\hat{M}_y = \frac{\chi_0 \lfloor \hat{H}_x (\omega_z \tau) + (j\Omega\tau + 1)\hat{B}_y / \mu_0 \rfloor}{[(\omega_z \tau)^2 + (j\Omega\tau + 1)(j\Omega\tau + 1 + \chi_0)]} \qquad (6.0)$$

In Equations 5.0 and 6.0, $\hat{B}_y$ is the mean magnetic flux density (hereinafter "flux density") directed in the Y-axis direction, $\mu_0$ is the permeability of free space, and $\omega_z$ is the spin velocity of the nanoparticle 10. The magnetic intensity $\hat{H}_x$ and flux density $\hat{B}_y$ are imposed on nanoparticles 10, resulting in angular spin $\omega_z(y)$ 39 and that varies with position in the Y-axis direction. Due to the magnetic poles of magnetic nanoparticles 10, the nanoparticles 10 will tend to align with the rotating magnetic field. In general, there will be a phase difference between the rotating magnetic field and the magnetized nanoparticles 10. Magnetic field and mechanical coupling results in angular spin speed 39. The components $\hat{B}_y$ and $\hat{H}_x$ cause mechanical torque. The time averaging torque in Z-axis direction is $$\langle \hat{T}_z \rangle = \tfrac{1}{2} \Re e[\hat{M}_x \hat{B}_y - \mu_0 \hat{M}_y^*(\hat{H}_x + \hat{M}_x)] \qquad (7.0)$$

In Equation 7.0, $\hat{B}_y$ is the complex conjugate of $\hat{B}_y$ and $\hat{M}_y$ is the complex conjugate of $\hat{M}_y$. The spin angular momentum $\hat{L}_s$ 41 moves with torque $\hat{T}_z$ 42, which is directed in the Z-axis. The angle between Force $\hat{F}_y$ and torque $\hat{T}_z$ 42 is 90°, as shown in FIG. 3B.

The magnetic intensity $\hat{H}_x$ is axial in the limiting case and is given by:

$$\hat{H}_x = jH_0 \qquad (8.0)$$

In Equation 8.0, $H_0$ is the normal magnetic field intensity. The flux density $\hat{B}_y$ is transverse and directed in the limiting case, and is given by:

$$\hat{B}_y = \mu_0 H_0 \qquad (9.0)$$

In Equation 9.0, $H_0$ is the normal magnetic field intensity. $\hat{H}_x$ and $\hat{B}_y$ have a phase difference of 90°. The net effect of Equation 8.0 and Equation 9.0 is a rotating magnetic field in the X-Y plane acting on each nanoparticle 10.

An aspect of the present disclosure involves the solution of Equation 7.0. By substituting Equation 5.0, Equation 6.0, Equation 8.0, and Equation 9.0 into Equation 7.0, the solution of Equation 7.0 is:

$$\langle \hat{T}_z \rangle = \frac{\chi_0}{2} \Big[ -\omega_z \tau \big\{ |\hat{B}_y/(\mu_0 \hat{H}_0)|((\omega_z\tau)^2 + (\Omega\tau)^2 + 1) + \qquad (10.0)$$

$$|\hat{H}_x/H_0|\{(\omega_z\tau)^2 - (\Omega\tau)^2 + (1 + \chi_0)^2\}\big\} +$$

$$2\Re_e\{\{\chi_0(\omega_z\tau)^2 - (\Omega\tau)^2 + j\Omega\tau((\omega_z\tau)^2 - (\Omega\tau)^2 - 1 - \chi_0)\}$$

-continued $$(\hat{H}_x/H_0)(\hat{B}_y/(\mu_0 H_0))\}\Big] /$$

$$\big[\{(\omega_z\tau)^2 - (\Omega\tau)^2 + 1 + \chi_0\}^2 + (2 + \chi_0)^2(\Omega\tau)^2\big]$$

One aspect of the system is that each nanoparticle 10 experiences torque 42, which causes the nanoparticle 10 (and henceforth the surrounding ferrofluid 16A) to spin. The spin angular momentum 41 moves with the torque 42.

Figure 3C:
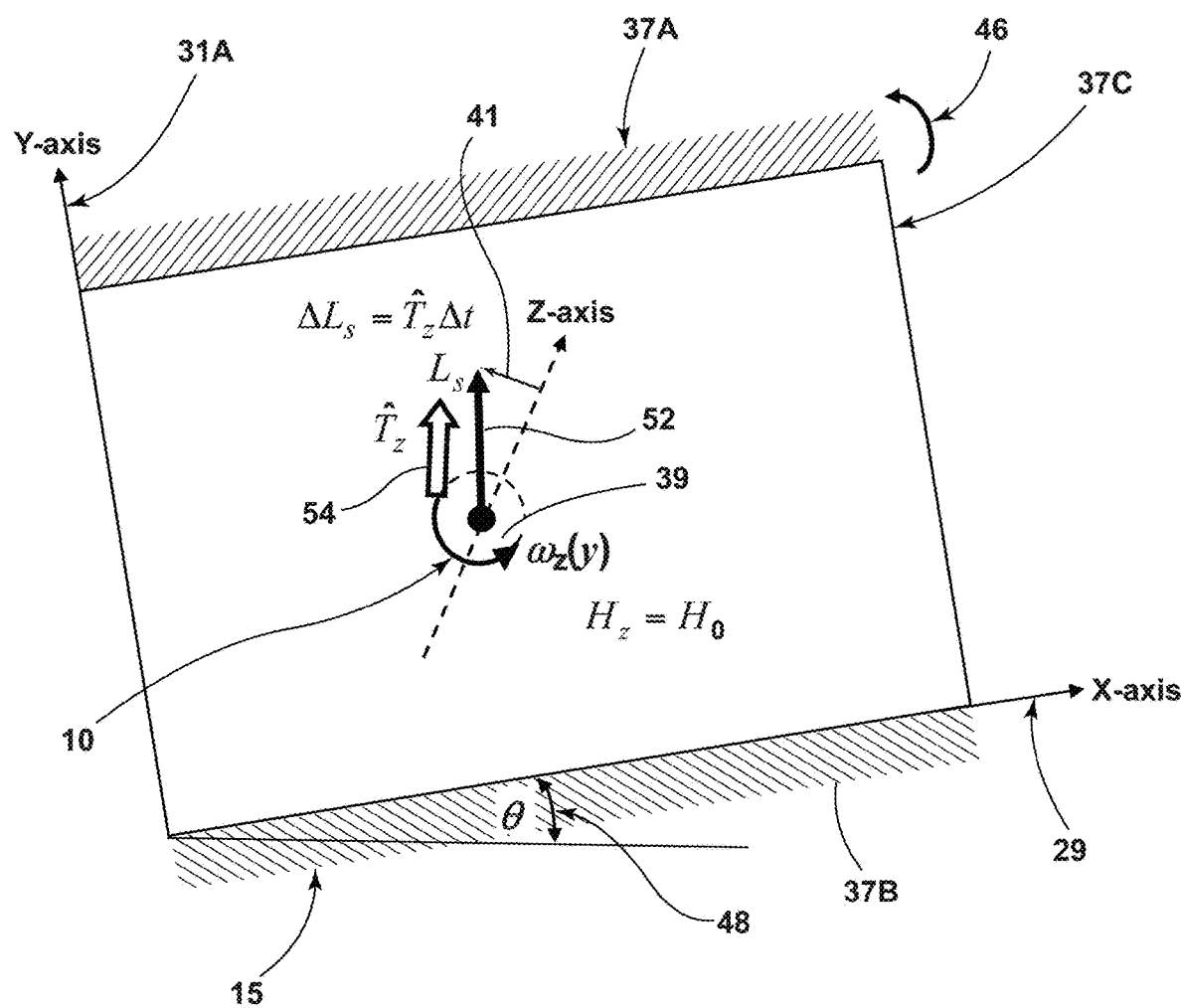
FIG. 3C is a schematic view of a spinning nanoparticle showing how the spinning nanoparticle should tilt up when an external torque acts on the nanoparticle.

FIG. 3C shows a further extension of FIG. 3B. Specifically, FIG. 3C shows an external applied torque 52 in the direction of a torque 54 when container 15 (with rigid walls 37A and 37B) is tilted in the direction 46. The flip/tilt direction 46 causes the container 15 to tilt by angle 48 (arrow "θ"). The external torque 52 on the spin angular momentum 41 "should" (will tend to) move the axis of, spinning plane 39 of nanoparticle 10, and thereafter "should" move (will tend to) or tilt the spinning plane 39 of each nanoparticle 10. Nanoparticle 10 will still be spinning with angular spin speed $\omega_z(y)$ 39, but the plane of nanoparticle 10 "should" flip or tilt up. The flip or tilt of the spin angular momentum and the plane of rotation of the nanoparticle 10 will not occur. This phenomenon is called "gyroscopic precession" (hereinafter "precession"). The spin angular momentum 41 will chase or move towards the direction of the torque 54. This movement does not cause the spinning plane 39 of nanoparticle 10 to tilt in the x-y plane formed at X-axis 29 and Y-axis 31A.

Figure 3D:
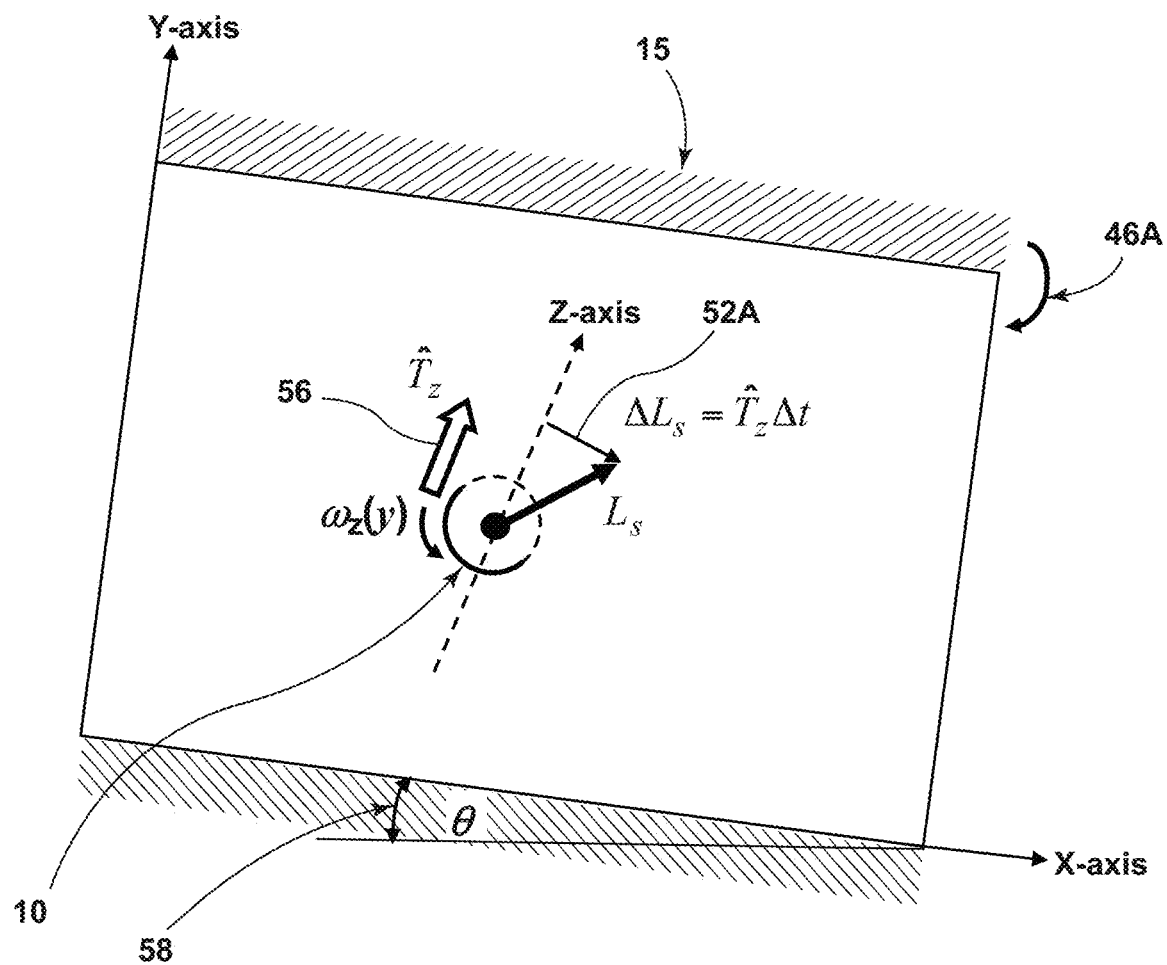
FIG. 3D is a schematic view of a spinning nanoparticle showing how the spinning nanoparticle should tilt down when an external torque acts on the nanoparticle.

FIG. 3D shows a further extension of FIG. 3B. More specifically, FIG. 3D shows an external applied torque 52A in a direction shown by arrow 56 when container 15 is tilted an angle 58 (arrow θ) in a direction shown by arrow 46A. In a similar fashion, nanoparticle 10 will still be spinning with angular spin speed $\omega_z(y)$ 39. The plane of nanoparticle 10 "should" flip or tilt down, but it does not.

FIGS. 3C and 3D show that axis of the spin angular velocity will chase or move towards the direction of the torque (from the rotating magnetic field), but the spin speed of the nanoparticle stays constant at $\omega_z(y)$. In FIGS. 3C and 3D, the external torque only flips or tilts the spinning plane of the nanoparticle 10 up or down.

Equation 10.0 can be further simplified. Specifically, the non-precession torque τnp is $$\tau_{np} = I\alpha - 6\eta V \omega_z(y) \qquad (11.0)$$

where I is the moment of inertia of the nanoparticle, α is the angular acceleration, η is the frictional and viscosity of the fluid, V the hydrodynamic volume of nanoparticle, and $\omega_z(y)$ is angular speed of nanoparticle. The frictional and viscous drag of the solution is $-6\eta V \omega_z(y)$.

Figure 4:
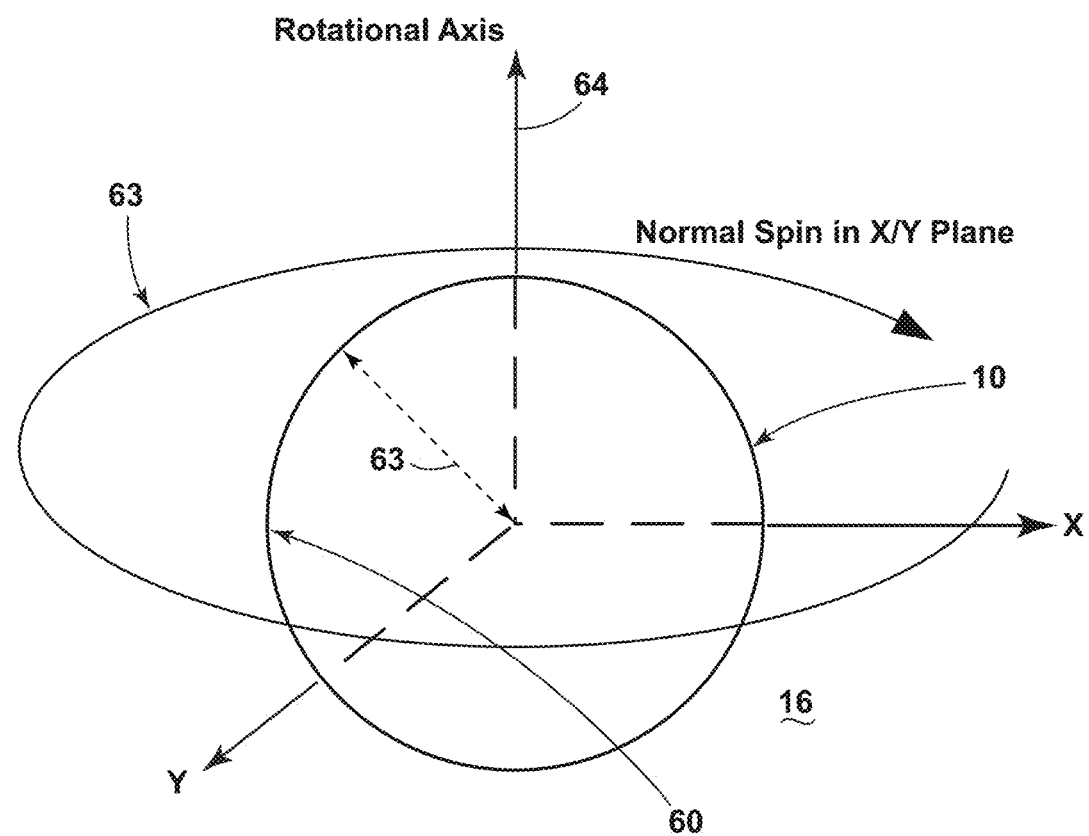
FIG. 4 is a schematic view showing torque applied to spin a magnetic nanoparticle when an external force is tangentially exerted on the nanoparticle.

FIG. 4 shows the characteristics of a gyroscope. These include torque, rotational inertia, and precession. An applied torque tends to spin an object due to the rotational inertia. If a nanoparticle 10 that is spinning experiences a disturbance (force), whether be it friction, gravity, or other acceleration, precession (movement of the axis of rotation of the nanoparticle 10) results. As discussed above, the nanoparticle 10 is suspended in solution 16. A tangential force 60 is exerted on nanoparticle 10 about a radius 62. The nanoparticle 10 spins along path 403 about its axis (z axis) 64 and in the x-y plane. The resulting torque is the cross product of the force 60 and radius 62.

The nanoparticle 10 is subjected to different pressures and varying levels of magnetic fields, both direct and varying. Magnetic moments can be measured for both multiphase and single phase nanoparticles. For nanoparticles of magnetite (Fe3O4), the magnet moment M for magnetite at levels of alternating magnetic field between 5 mT and 10 mT is approximately $0.025 \times 10^{-6}$ Am².

Figure 5:
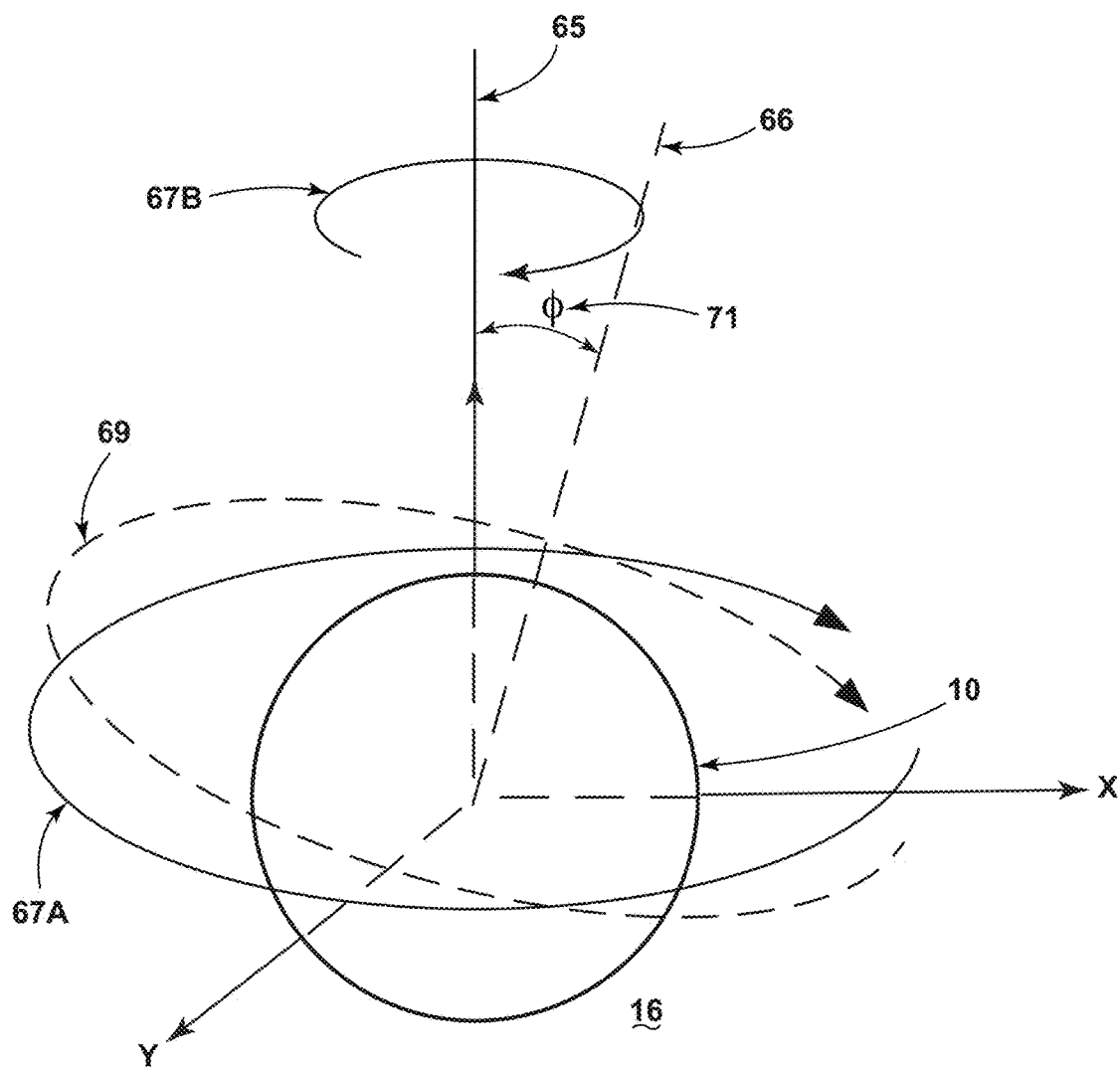
FIG. 5 is a schematic view of a gyroscope, wherein a torque is applied to tilt the axis and cause nanoparticle precession.

FIG. 5 shows a situation in which there is an additional torque that could occur externally if a nanoparticle 10 experiences a disturbance force. The disturbance force could be due to friction, gravity, or other acceleration. The nanoparticle 10 is suspended in solution 16 and initially spins about an axis 65. Nanoparticle 10 acts as a gyroscope, and an additional torque is applied to tilt the axis from axis 65 to axis 66. This additional torque is not applied to keep the nanoparticle 10 spinning about its axis 65. This results in a motion of the rotational axis around the nominal alignment at an angular velocity. This is different, and at a much lower speed than the rotational speed of the object itself, as shown in FIG. 5. The nanoparticle 10, when undisturbed, spins about the z axis 65 as shown by arrows 67A and 67B. An external torque moves spin 69 axis toward either the x or y axis 66. Overall, momentum is preserved, but a second spin component is added. Small variations in angle ϕ71 result in an inertial force. The torque associated with the inertial force is an approximate representation of precession torque. This precession torque may be utilized to determine angular displacement in a gyroscopic sensor with rotating nanoparticles according to the present disclosure. By measuring the energy required to overcome this torque, the precession angle can be derived. The precession torque τp is $$\tau_p = \omega_p I \omega_z(y) - 6\eta V \omega_z(y) \quad (12.0)$$

where $\omega_p$ is the precession angular speed, I is the moment of inertia of nanoparticle, $\omega_z(y)$ angular speed of nanoparticle, η is the frictional and viscosity of the fluid, and V the hydrodynamic volume of nanoparticle. The frictional and viscous drag of the solution is $-6\eta V \omega_z(y)$.

Figure 6:
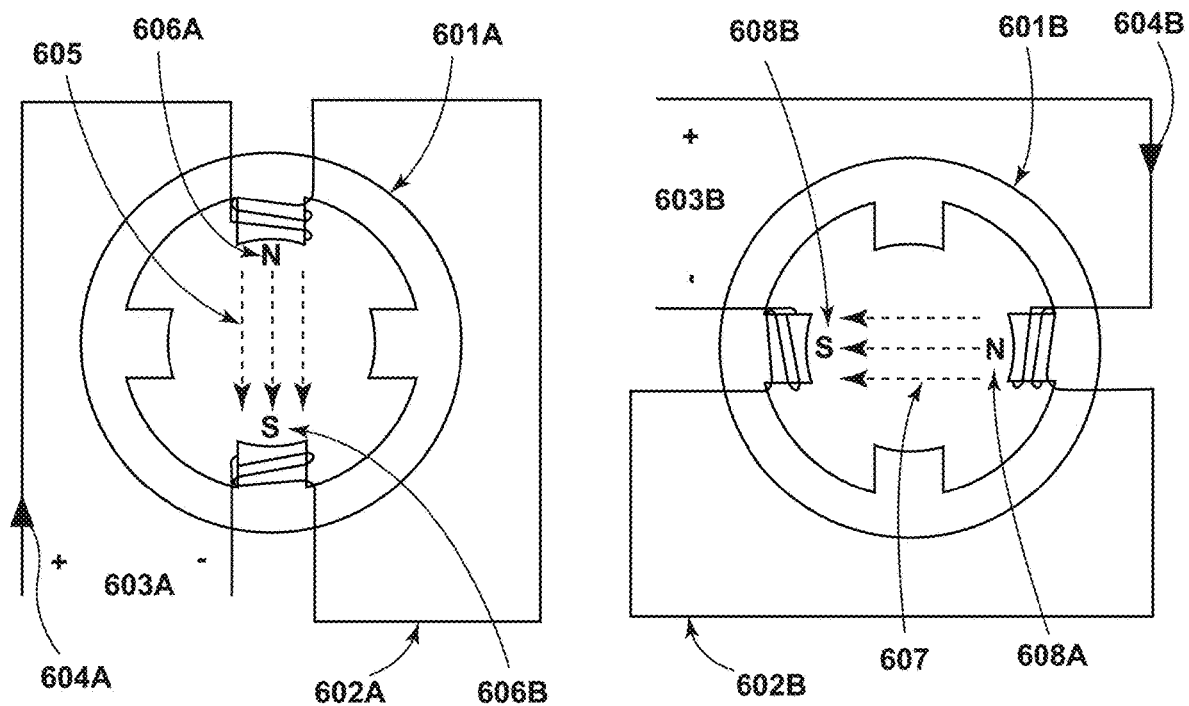
FIG. 6 shows two poles produced by a winding on a stationary structure ("stator") that can attract or repel a rotating permanent magnet.

With further reference to FIG. 6, a magnetic field 605 can be generated to attract or repel poles of a rotor. The stator includes first and second parts 601a and 601b, respectively, and includes first and second phase coils 602a and 602b, respectively. The coils 602a and 602b are wound on slots of the stator. Voltages 603a and 603b carry currents 604a and 604b, respectively. Currents 604a and 604b are 90° out of phase. The coils 602a and 602b are wound 90° apart relative to each other to create four poles. Each coil 602a, 602b is wrapped Nm effective times (hereinafter called effective number of turns) around the magnetic core container. Each coil 602a, 602b carries sinusoidal AC current of maximum value lm. A magnetic field 605 across the north "N" pole 606a and the south "S" pole 606b is created due to the electrical current. A magnetic field 607 across the N pole 608a and the S pole 608b is also generated. A plurality of poles can be created depending on the plurality of spaces used in winding the coils. In this case the number of poles is equal to four for two separate coils. In FIG. 6 the stator is shown two times illustrating how each pair of poles is obtained for two independently wound coils.

Figure 7:
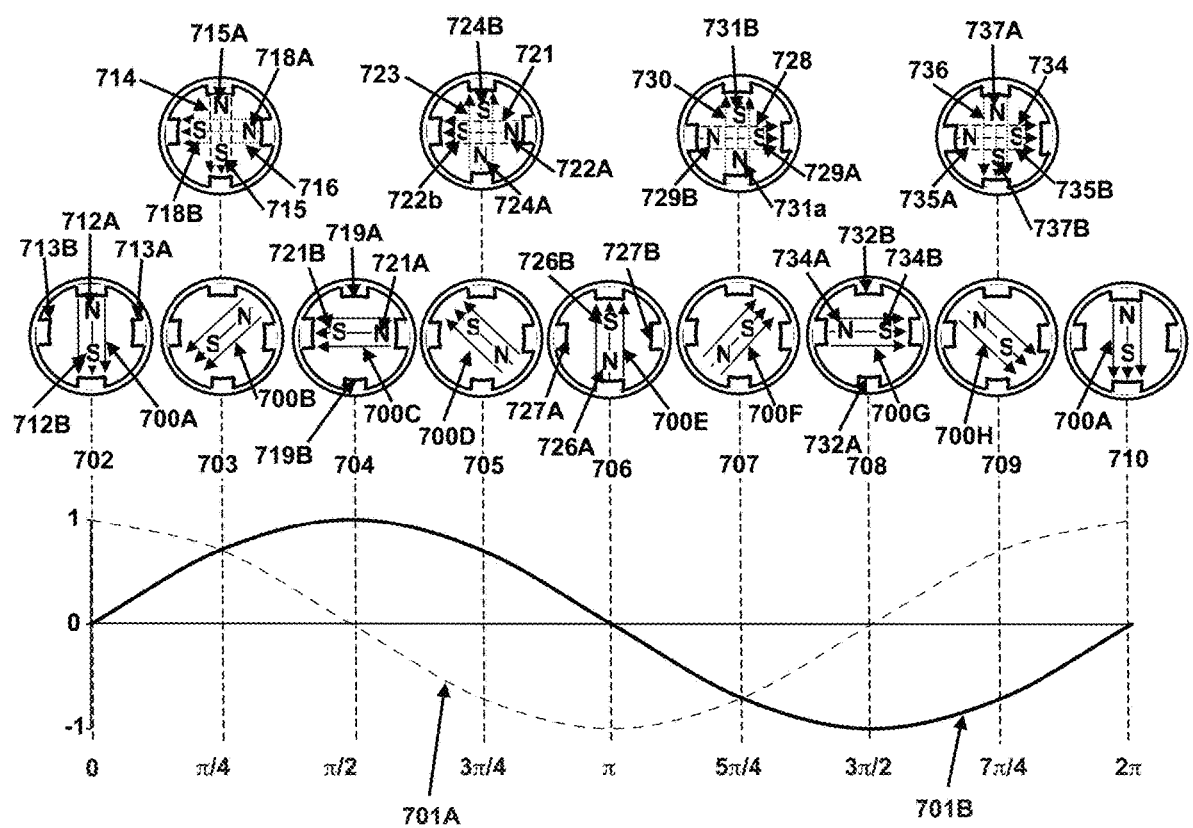
FIG. 7 illustrates how four poles produced by two physical windings 90° apart in space on the stator and carrying currents 90° out of phase generate a rotating magnetic field that results in the rotor pole phase stages as the rotor rotates continuously.

FIG. 7 shows an embodiment in which moving magnetic fluxes 700a, 700b, 700c, 700d, 700e, 700f, 700g, and 700h with polarities that occur about a central point or axis. The two coils carry sinusoidal current waveforms 701a and 701b that are 90° out of phase. Consider the specific angular positions 702, 703, 704, 705, 706, 707, 708, 709, and then repeats at position 710.

At the angular position 702, the current in phase 701a is a positive maximum so that there is magnetic flux 701a across the N pole 712a and S pole 712b. The current in phase 701b is zero so that there is no magnetic flux between 713a and 713b. The resultant magnetic flux is 700a.

At the angular position 703, there is positive current in phase 701a so that there is magnetic flux 714 across the N pole 715a and S pole 715b. There is also positive current in phase 701b so that there is magnetic flux 716 between N pole 718a and S pole 718b. The magnetic fluxes 714 and 716 cannot cross but there is resultant magnetic flux is 700b.

At the angular position 704, the current in phase 701a is zero so that there is no magnetic field across the 719a and 719b. The current in phase 701b is positive maximum so that there is magnetic flux 720 between N pole 721a and S pole 721b. The resultant magnetic flux is 700c.

At the angular position 705, there is negative current in phase 701a so that there is magnetic flux 721 across the N pole 722a and S pole 722b. There is also positive current in phase 701b so that there is magnetic flux 723 between N pole 724a and S pole 724b. The magnetic fluxes 721 and 723 cannot cross but there is resultant magnetic flux is 700d.

At the angular position 706, there is maximum negative current in phase 701a so that there is magnetic flux 700e across the N pole 726a and S pole 726b. The current in phase 701b is zero so that there is no magnetic flux between 727a and 727b. The resultant magnetic flux is 700e.

At the angular position 707, there is negative current in phase 701a so that there is magnetic flux 728 across the N pole 729a and S pole 729b. There is also negative current in phase 701b so that there is magnetic flux 730 between N pole 731a and S pole 731b. The magnetic fluxes 728 and 730 cannot cross but there is resultant magnetic flux is 700f.

At the angular position 708, there is zero current in phase 701a so that there is no magnetic flux across the N pole 732a and S pole 732b. The current in phase 701b is negative maximum so that there is magnetic flux 700g between 734a and 734b. The resultant magnetic flux 700g.

At the angular position 709, there is positive current in phase 701a so that there is magnetic flux 734 across the N pole 735a and S pole 735b. There is also negative current in phase 701b so that there is magnetic flux 736 between N pole 737a and S pole 737b. The magnetic fluxes 734 and 736 cannot cross but there is resultant magnetic flux is 700h.

The angular position 710 is a repeat of the angular position 702, and the resultant magnetic flux is 700a. The moving magnetic fluxes 700a, 700b, 700c, 700d, 700e, 700f, 700g, and 700h have polarities rotating at the same constant frequency as the frequency of the input currents. The resultant magnetic fluxes rotate about a central point or axis to thereby generate a rotating magnetic field.

The rotating magnetic field or flux ϕ variation with time t is $$\phi(\theta, t) = k N_m I_m \cos(2\pi f t - \theta) \quad (13.0)$$

where k is constant of proportionality, $N_m$ is the effective number of turns of each coil, θ is the magnetic axis of coil 602a (hereafter, the magnetic axis of coil 602b is θ+90°), $I_m$ is the maximum AC current in each coil, and f is the frequency of the AC currents.

Figure 8:
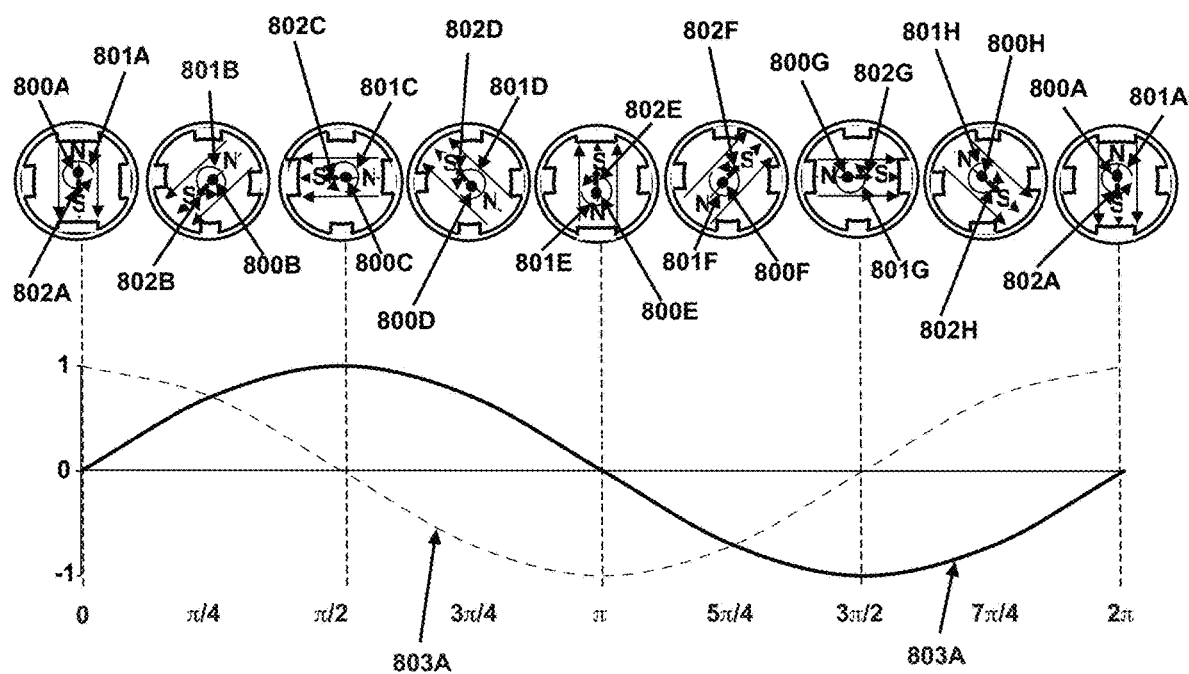
FIG. 8 is schematic diagram showing a nanoparticle aligning its magnetic axis to rotating magnetic field, spins on its own axis in a confined area and kept from drifting toward the wires or magnetic sources, wherein the rotating magnetic field tends to keep the axis of the nanoparticle locked in one position but spinning.

With reference to FIG. 8, the two coils carry sinusoidal current waveforms 803a and 803b that are 90° out of phase. A nanoparticle in the rotating magnetic field is confined to 800a, 800b, 800c, 800d, 800e, 800f, 800g, and 800h, and 800a. The magnetic field creates a field vector to which the nanoparticle's magnetic moment is constantly aligned to and along the path 802a, 802b, 802c, 802d, 802e, 802f, 802g, and 802h, and 802a (or slightly lagging). The direction is constantly controlled while it rotates, like the hour hand of a clock. The nanoparticle spins along the path 801a, 801b, 801c, 801d, 801e, 801f, 801g, 801h, and 801a. The magnetic field generates sufficient force (torque) acting on the nanoparticle to overcome the viscosity of the fluid when suspended in solution. The axis of the nanoparticle remains at a particular orientation due to the rotating magnetic field. The nanoparticle aligns its magnetic axis with the rotating magnetic flux direction.

Figure 9:
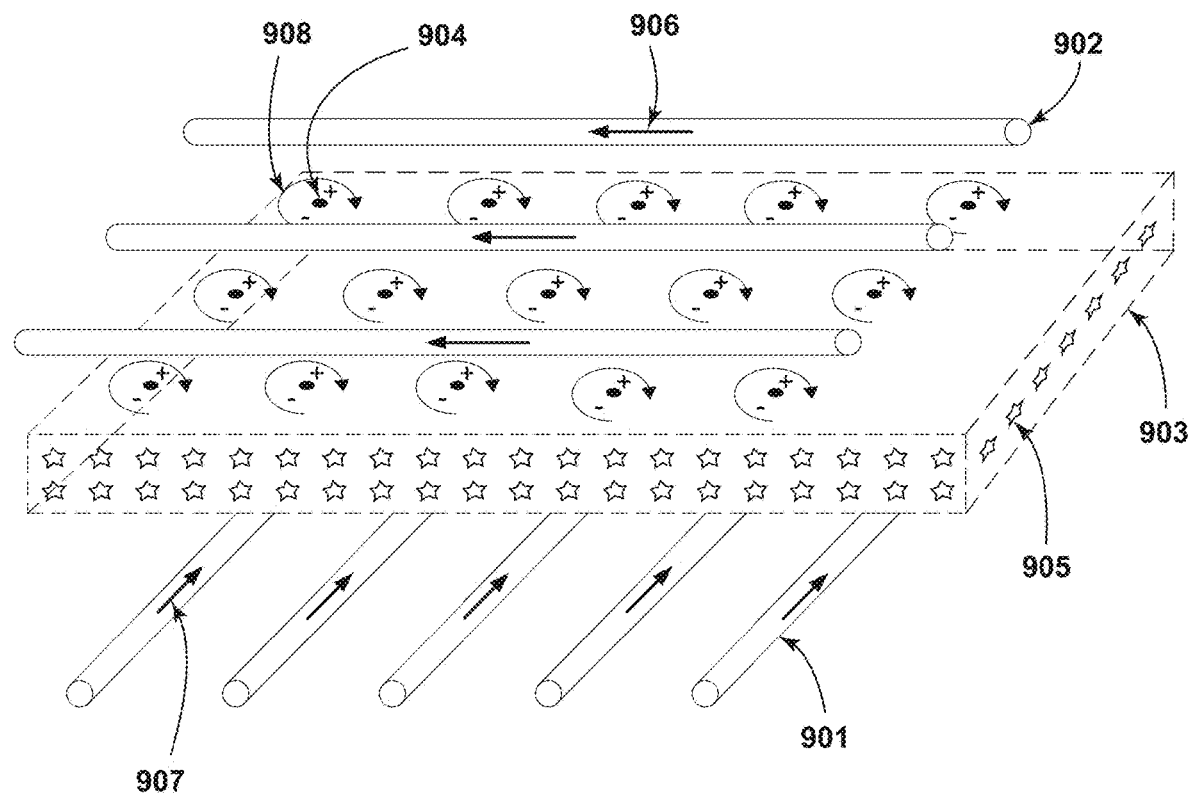
FIG. 9 is a schematic isometric view of first and second sets of conductors (e.g. wires) that are oriented transverse (perpendicular) to one another and carry electrical currents that are 90° out of phase relative to each other, wherein the first and second sets of conductors are wound on (around) a rectangular cuboid core containing magnetic nanoparticles in solution to produce a rotating magnetic field whereby the magnetic nanoparticles maintain their position and spin freely while minimizing the risk of overcrowding and collisions.

With further reference to FIG. 9, increasing the number of nanoparticles 904 amplifies the overall signal, provided nanoparticle interaction is minimized. To improve effectiveness, the number of wires is maximized while keeping the volume of the magnetic core container 903 to a minimum. In FIG. 9, first and second sets of insulated wires 901 and 902 are oriented perpendicular to each other (90° apart). A magnetic core container 903 contains a plurality of nanoparticles 904 in solution 905. The perpendicular sets of wires 901 and 902 conduct AC currents 906 and 907, which are 90° out phase. The number of wires is preferably maximized while the volume of container 903 is kept to a minimum. The number of wires may be based, at least in part, on the gauge of the wires. The gauge of the wires may be selected based on the amount of current or magnetic field required. Each horizontal wire above and below the nanoparticles 904 conducts current in phase. In the configuration of FIG. 9, the nanoparticles are all drawn to a single point. Thus, the nanoparticles can maintain their relative positions and spin along the path 908 freely while minimizing the risk of overcrowding and collisions.

Figure 10:
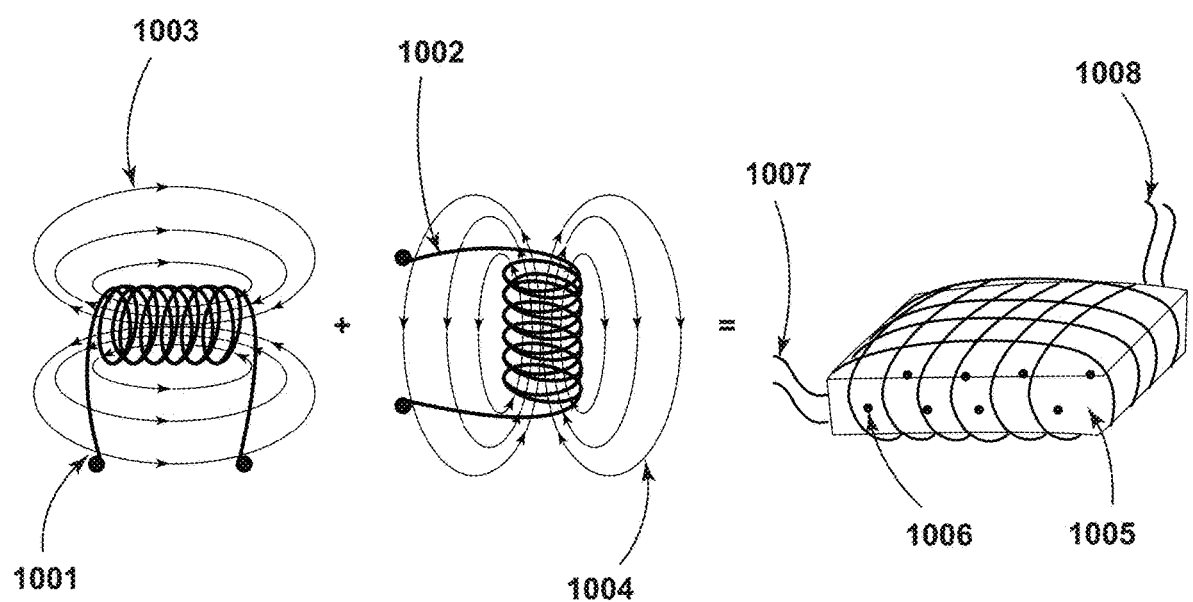
FIG. 10 is a schematic isometric view of the magnetic fields produced by two orthogonal coils that are wound a rectangular cuboid core containing the magnetic nanoparticles is solution.

FIG. 10 shows a hybrid device/method of rotating the magnetic nanoparticles. The configuration of FIG. 10 provides some of the advantages of the planar configuration/method of FIG. 9 and the Helmholtz coil configuration/method of FIG. 2. The device/method of FIG. 10 utilizes two independent coils 1001 and 1002. Each coil is wound perpendicular to the opposing coil as shown in FIG. 10. This configuration produces a relatively uniform magnetic field 1003 and 1004 inside the coils 1001 and 1002 and maintains the perpendicular fields of the planar configuration to eliminate the chance of rotation glitches when the nanoparticles align with the coil field extremes. The coils are wound on a magnetic core container 1005 filled with a solution of nanoparticles 1006. Coil 1007 carries AC current and coil 1008 carries AC current that is 90° out of phase with the AC current in coil 1007. If the wire forms infinite round solenoids, the magnetic field would be totally uniform.

Figure 11:
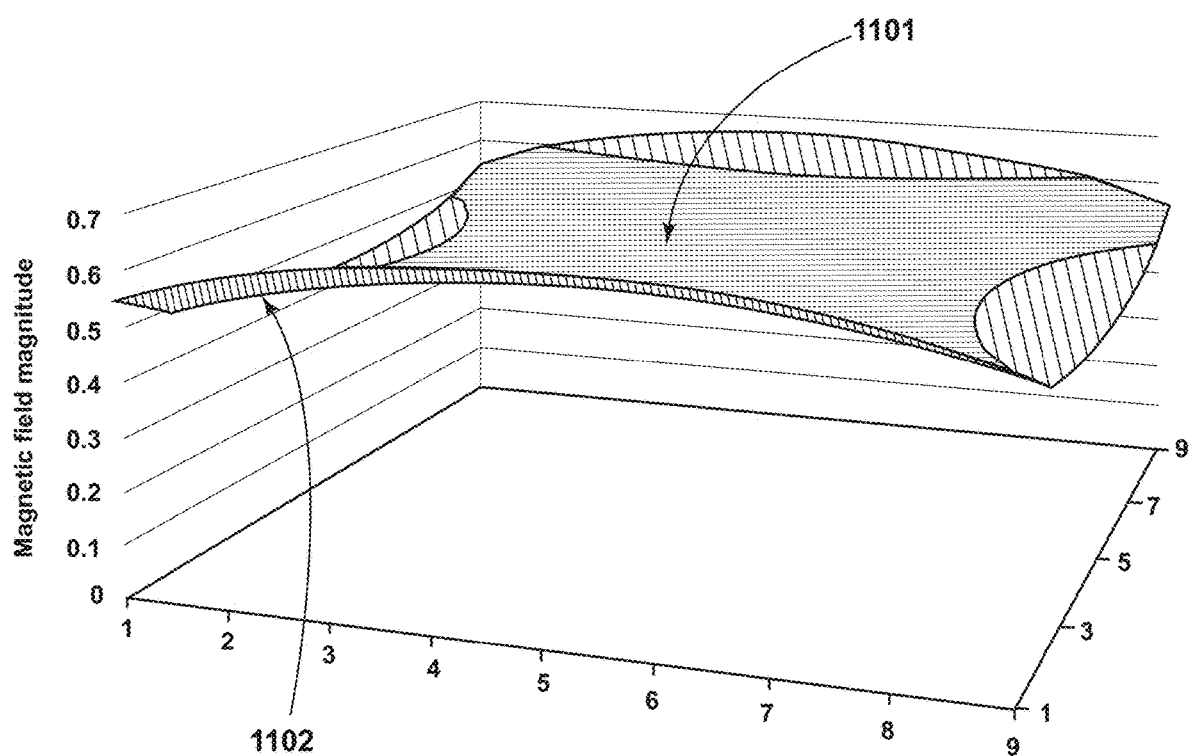
FIG. 11 is a 3D graph showing the magnetic field variations inside the rectangular cuboid magnetic core, wherein the average magnetic field density is 0.002 Tesla (20 Gauss)

With further reference to FIG. 11, MATLAB/SIMULINK and the Biot-Savart law may be is used to estimate the field variation in the magnetic core container of the sensor. Inside the sensor, the field rotates at the same speed. However, there may be distortions near the corners of the body of the sensor. The corners of the sensor are most affected by the geometry of the core. The surface 1101 does not have a flat response across the entire surface. This is expected for an ideal sensor. The variation can be reduced or eliminated with a flatter, wider sensor and with more windings. The highest magnetic intensity is located inside 1101 while 1102 has the lowest magnetic intensity.

Figure 12:
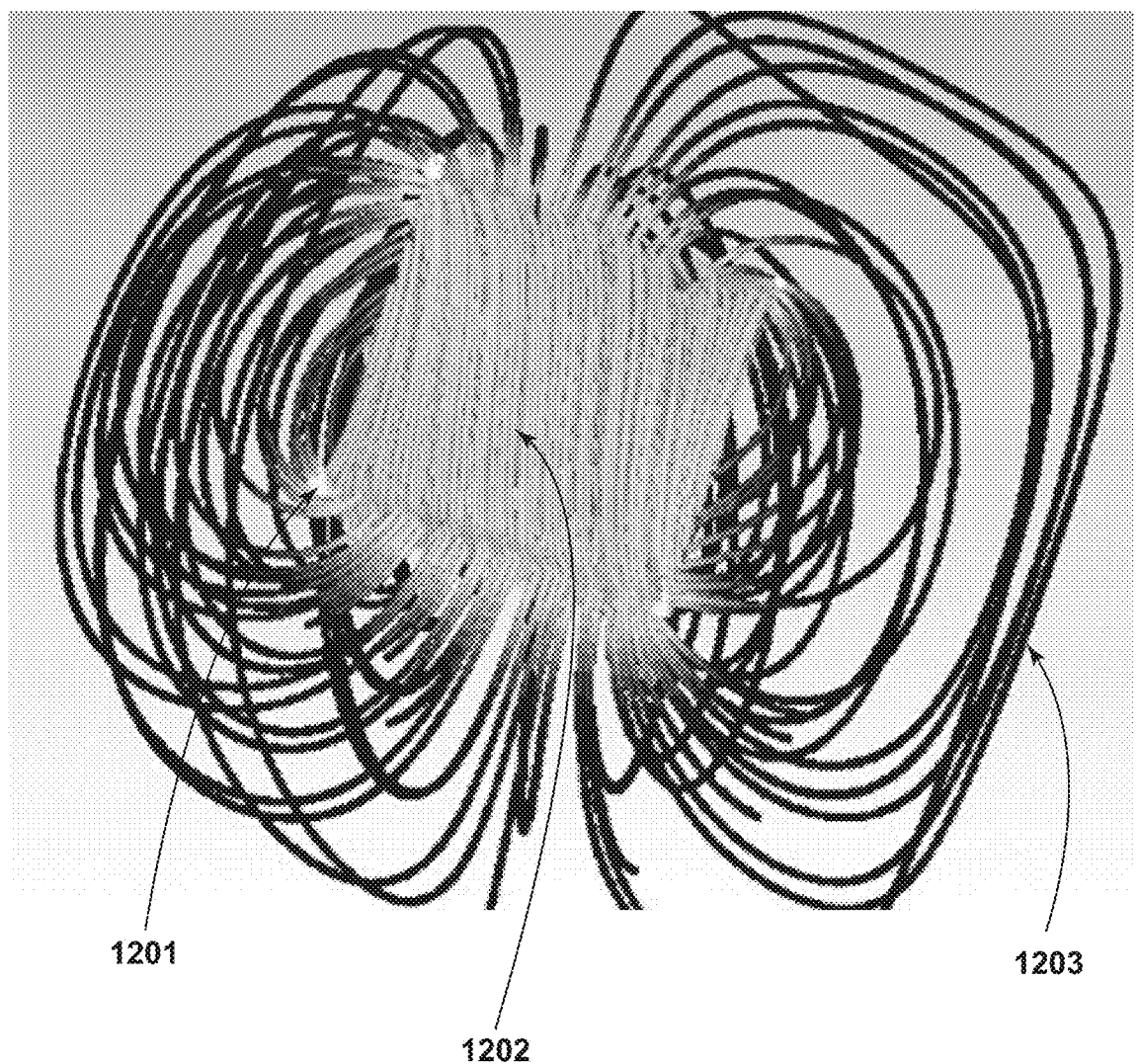
FIG. 12 is an isometric view showing the intensity of the magnetic field in the rectangular cuboid core, wherein the highest intensity is inside the enclosure and wherein gray corresponds to higher intensity and black corresponds to the lowest intensity.

FIG. 12 shows computer modeling of the near and far electromagnetic fields of the magnetic signature of the sensor's magnetic core container. FIG. 12 also shows the range and direction of the magnetic field, both internal and external to the sensor. The number indicates the intensity of the magnetic field. The magnetic field intensity 1201 to 1202 correlates to higher intensity, while 1203 is the lowest. The highest intensities 1201 are located, as preferred, inside the enclosure. Calculated magnetic fields inside the sensor averaged around 0.002 Tesla. As a comparison, the Earth's magnetic field measures about 0.5 Gauss at the surface. One Tesla is equivalent to 10,000 Gauss. Thus, the sensor generates about 40 times the magnetic field strength of the Earth.

Figure 13A:
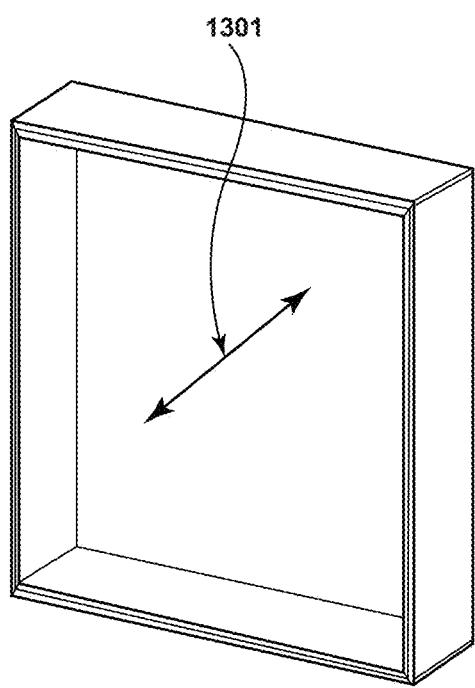
FIG. 13A is an isometric view showing the relative magnetic field direction at a particle location at a first time.
Figure 13B:
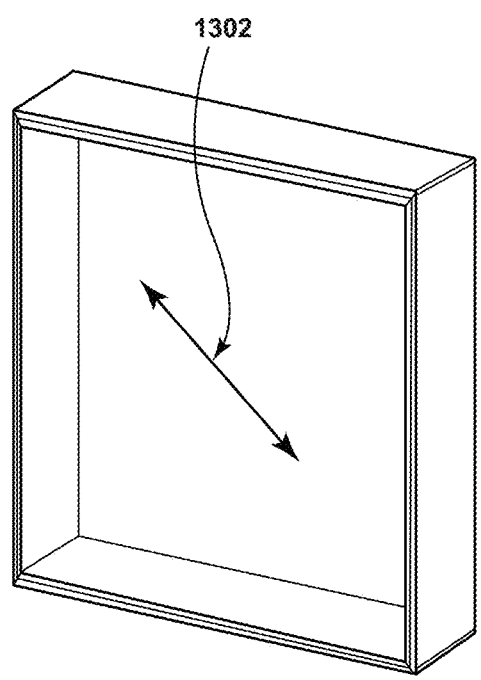
FIG. 13B is an isometric view showing the relative magnetic field direction at a particle location at a second time that is later than the first time.

FIGS. 13A and 13B show computer modeling of magnetic directions 1301 and 1302 within the cuboid rectangular magnetic core container of continuous fluid with nanoparticles. The changing of the magnetic direction from 1301 to 1302 with time does not affect the fixed positions of the nanoparticles and the nanoparticles continue to spin.

As the rotational frequency of the magnetic field is increased, the hydrodynamic frictional force overcomes the magnetic torque. This is one cause of the phase delay between the nanoparticle orientation and the magnetic field orientation. At the breakdown frequency (and above), delays result in rotational breakdown, corrupting any sensory application reliant on the rotation. Thermal agitation is another source of phase delay. The breakdown frequency is dependent on magnetic field intensity. Magnetic field magnitude and frequencies are chosen as to keep the phase lag below 90 degrees. The magnetic field strength may vary from 5 mT to 10 mT. This has been shown to fall at frequencies between about 100 Hz and about 2000 Hz, with higher frequencies requiring a higher magnetic field strength.

Figure 14A:
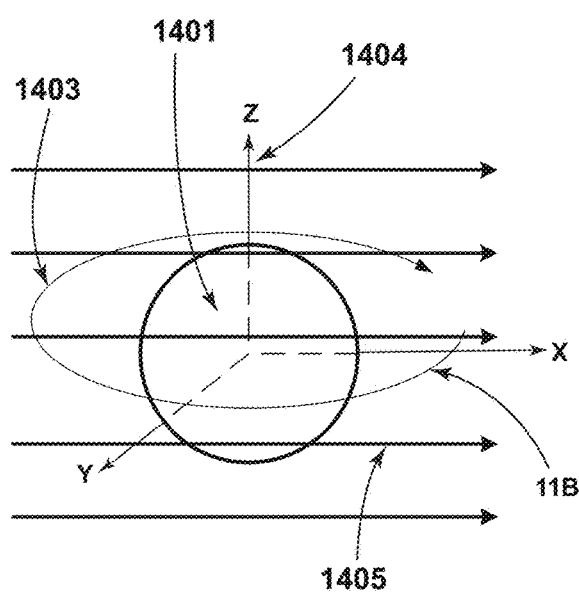
FIG. 14A is an isometric schematic view of a magnetic nanoparticle showing the direction of the rotating magnetic field flux lines wherein the magnetic nanoparticle spins on its own stationary axis, which is not "wobbling"
Figure 14B:
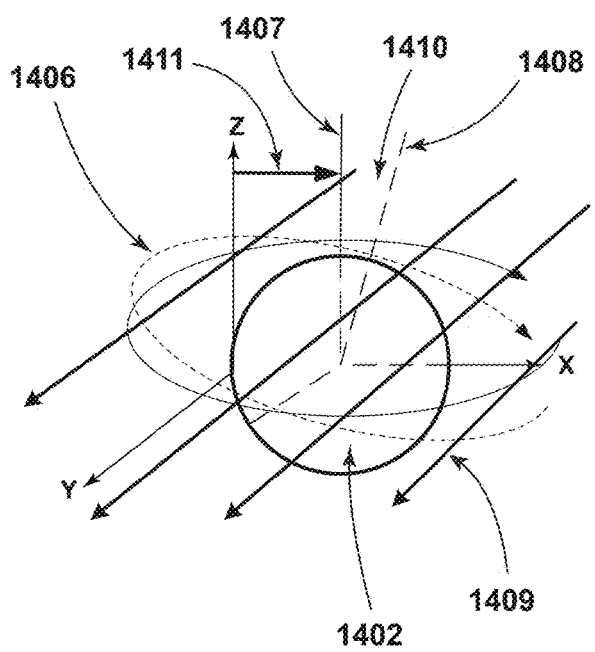
FIG. 14B is an isometric schematic view of a magnetic nanoparticle showing rotating magnetic field lines moments after a disturbance to the magnetic particle of FIG. 14A has occurred, magnetic nanoparticle precession, wherein magnetic nanoparticle realigns with the magnet field if the disturbance is removed.

The inter-relationship between the various components shown in FIGS. 1-13 is shown in FIGS. 14A and 14B. When a nanoparticle is closely aligned with the magnetic field, torque acting on the nanoparticle due to the magnetic field is at a minimum, and the nanoparticle absorbs sufficient energy to overcome hydrostatic friction. By examining nanoparticle 1401 and 1402, it can be seen how this type of sensor can be used to detect angular acceleration. Like a simple gyroscope, each nanoparticle spins as shown by the arrow 1403 on its own rotational axis 1404 in its relatively confined area. Any "wobble" of its axis of rotation 1404 due to precession will be negated. The magnetic field acts as a gimbal, keeping the axis of rotation 1404 "locked" at a fixed orientation, unless the nanoparticle is disturbed by an external force. The nature of the AC currents utilized in the sensor keep the nanoparticles from drifting together toward the wires or toward weaker magnetic sources. Magnetic forces acting on the nanoparticles due to the magnetic field cause the magnet moment axes of the nanoparticles to align with the magnetic field flux direction 1405, which is constantly rotating.

If the system experiences an angular shift (rotation) due to, for example, banking of an airplane or other external force, the moment axis of the nanoparticle also shifts (rotates) off its prior axis. The nanoparticle motion is mostly now due to rotational inertia. A slight shift during the disturbance is possible, but the rotational inertia and effect of the rotation magnetic field would be unaffected as the magnetic field is relatively uniform throughout the sensor 1411. When the nanoparticle is experiencing precession, the spin is no longer controlled by the rotating magnetic field because the axis of rotation of the nanoparticle is no longer aligned with the axis of rotation of the magnetic field. The energy required to keep the nanoparticle rotating on its axis is not decreased, and a drop in current is expected. The shift (rotation of the sensor) may result in precession, and torque acting on the nanoparticle is required to produce the precessed rotation. The torque introduced by the external force is overcome by the same magnetic force that keeps the nanoparticle spinning along trajectory 1406. The only difference is that the spinning axis (axis of rotation) of the nanoparticle has been moved (rotated) from 1407 to 1408 and must be realigned back to the stable position 1407 before the disturbance. The direction of the rotating magnetic flux lines moments later after the disturbance is shown as 1409. The spin axis deviation angle θ, shown as 1410, is the difference between the magnetic flux direction and the orientation of the magnetic moment. Only the component of the magnetic field in line with the magnetic moment will continue to keep it spinning. Depending on the angle, this could drop the torque below the friction torque, resulting in a rapid reduction in speed (angular velocity) of the nanoparticle.

The remaining magnetic torque realigns the nanoparticle with the magnetic field. This precession rotation is caused by magnetic forces tending to realign the magnetic axis of the nanoparticle with the rotating magnetic field. Significantly, this is seen as a change in input current to the sensor because the rotating magnetic field is directly proportional to the input current of the sensor. When the external force is removed (angular acceleration ends), the precession ends and the current returns to the steady state of the undisturbed sensor. After the nanoparticle begins to rebound and realign with the magnetic field, an increase in the input current of the sensor is then expected, back to the equilibrium state. However, a consequence of this prediction is that the direction of rotation is indistinguishable, and clockwise rotation cannot be distinguished from counterclockwise rotation.

A greater disturbance to the rotation will result in a greater effect on the input current because a greater deviation from the magnetic field direction leaves less energy for rotation during precession. Each nanoparticle contributes resistance to the change in orientation. If more nanoparticles are contained in the solution, more energy is required to realign the nanoparticles (provided that nanoparticle to nanoparticle interaction is minimized). Each differential component of the wires in the sensor contributes to the magnetic flux for each nanoparticle. These individual contributions can be summed according to the Biot-Savart law to estimate the combined effect of the disturbance on the input current.

A basic idea or concept associated with the present disclosure (e.g. FIGS. 14A and 14B) is the precession of FIG. 3A, FIG. 3B, FIG. 3C, and FIG. 3D. The spin angular momentum 41 of FIG. 3C will chase or move in the direction of the torque 54. However, in FIG. 3B the angle between the axis of spin angular momentum 41 and the axis of the torque 42 is 90°. Therefore, no torque can be put or exist on the axis of the spinning nanoparticle 10. If the container 15 is tilted by applying an external torque, the direction of the spin angular momentum will not change but rather will stay in one direction indefinitely. However, the magnetic field (or magnetic flux) intensity will change. During precession, phase angle 1410 (FIG. 14B) between the magnet moment and the magnetic field is the vector sum of the angle between the magnetic moment and the magnetic field, and shaft of the axis of rotation or $\theta_2$ (i.e. 1410 of FIG. 14B).

The precession torque $\tau_p$ becomes $$\tau_p = \omega_p I \omega_z(y) - 6\eta V \omega_z(y) = MB_p \sin\theta_2 \quad (14.0)$$

Here Bp is the flux density of the magnetic field during precession and M is the maximum ferrofluid magnetization. The flux density Bp in Equation 14.0 is $$B_p = \frac{(I\omega_z(y)\omega_p - 6\eta V\omega_p)}{M\sin\theta_2} \quad (15.0)$$

The current i through a solenoid coil of N turns, length π, and flux density B is $$i = \frac{\lambda B}{N\mu} \quad (16.0)$$

Here μ is the permeability of the material inside the coil. Therefore using Equation 16.0, the precession current ip is $$i_p = \frac{(I\omega_z(y)\omega_p - 6\eta V\omega_p)\lambda}{N\mu M\sin\theta_2} \quad (17.0)$$

The phase angle between magnetic moment and the magnetic field during non-precession is $\theta_1$ (1410 value). The non-precession torque $\tau_{np}$ becomes $$\tau_{np} = I\alpha = 6\eta V\omega_z(y) = MB_p \sin\theta_1 \quad (18.0)$$

The flux density $B_{np}$ is $$B_{np} = \frac{(I\alpha - 6\eta V\omega_z(y))}{M\sin\theta_1} \quad (19.0)$$

Therefore using Equation 18.0, the non-precession current $i_{np}$ is $$i_{np} = \frac{(I\alpha - 6\eta V\omega_z(y))\lambda}{N\mu M\sin\theta_1} \quad (20.0)$$

The change in current during precession and non-precession Δi is $$\Delta i = i_p - i_{np} = \frac{1}{NM\mu}\left[\frac{(I\omega_z(y)\omega_p - 6\eta V\omega_z(y))}{\sin\theta_2} - \frac{(I\alpha - 6\eta V\omega_z(y))}{\sin\theta_1}\right] \quad (21.0)$$

If precession occurs due to an external torque on wall 37C (FIG. 3C) of the container 15, there will be no torque on the spinning nanoparticles 10, and the direction of the spin angular momentum 41 will not change (assuming no frictional losses). During precession, the direction of the spin axis of the angular momentum will not change. It is the applied rotating magnetic field's magnetic intensity becomes perturbed and the change is as shown by the current change of Equation 21.0. The current change that takes place in order to keep the axis of the spin angular momentum pointing in the same direction, is sensed. The axis of the spin angular momentum of the nanoparticle is used as the reference at all times such that no torque can be put on the spinning nanoparticle 10 even if the container 15 tilts.

Figure 15:
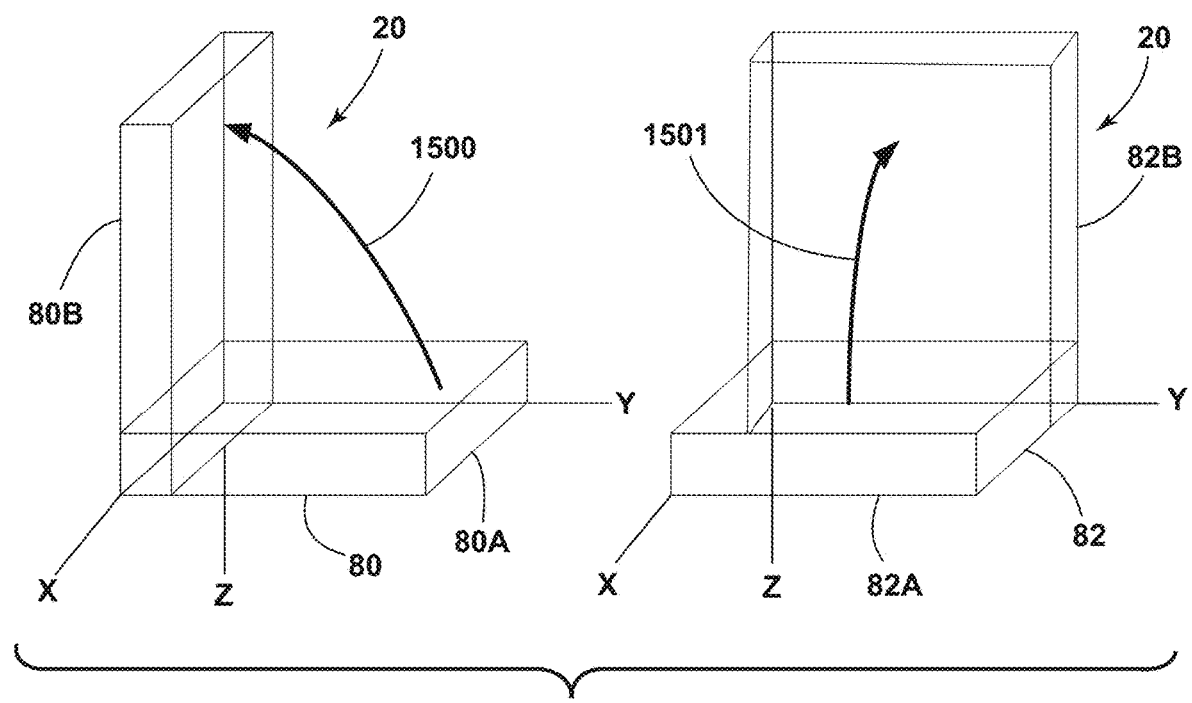
FIG. 15 is a schematic isometric view showing the orientation of magnetic particles wherein clockwise rotation cannot be distinguished from counterclockwise direction, wherein orientation A simply "rolls" while orientation B is flipped on end by 90°.

FIG. 15 shows schematic representations of two orientations (1500 and 1501) of motion of a sensor 20 according to the present disclosure. The sensor 20 includes two overlapping, out of phase coils of wire 80 and 82 carrying AC currents that are 90° out of phase. Each coil 80, 82 can sense one orientation (i.e. rotation about an axis). Rotating sensor 20 as shown by arrow 1500 causes a precessional disturbance which can be measured with coil 80, while the other coil 82 is unaffected. Similarly, the rotation shown by arrow 1501 rotates coil 82 from 82A to 82B. Rotation 1501 has the most significant effect on opposing coil 82. Accordingly, rotation about two orthogonal axis (e.g. x and 7) can be detected with one sensor 20 having two coils 80, 82.

Figure 16:
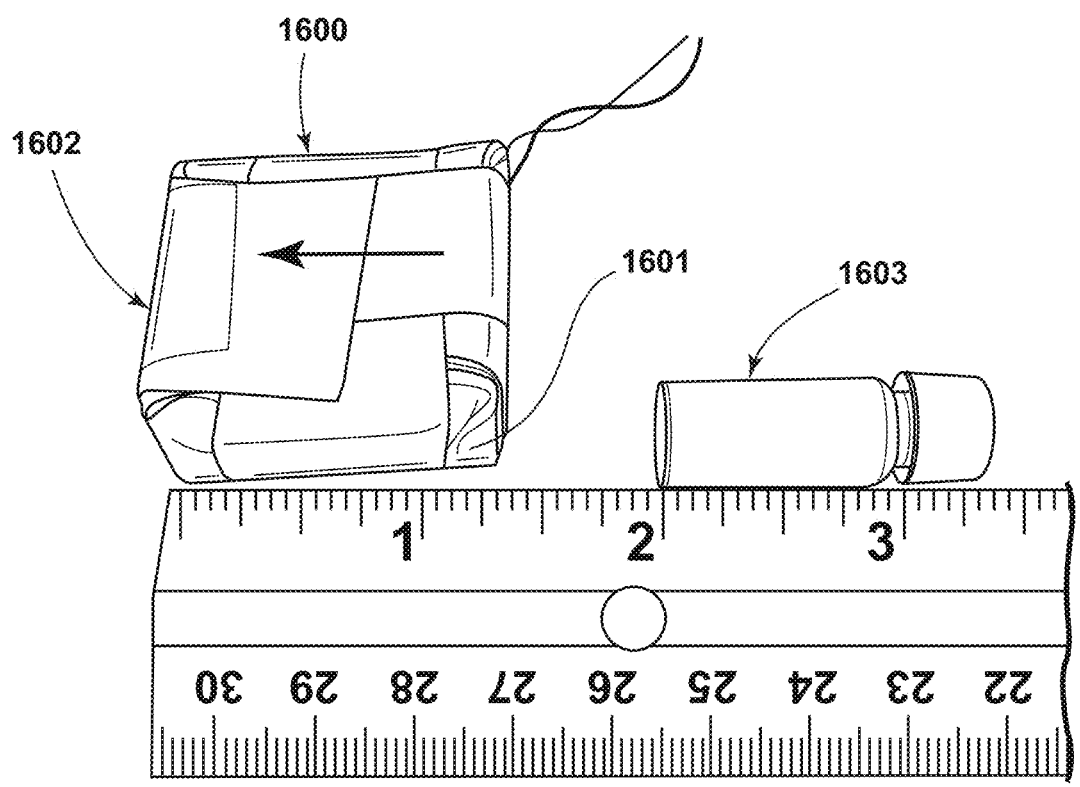
FIG. 16 is a partially fragmentary isometric view of a sensor and a portion of a ruler, wherein the sensor includes two windings wrapped around a rectangular cuboid core comprising magnetic particles disposed in a toluene or water solution.

FIG. 16 shows a sensor 1600 used to test the theory discussed above. The wires used to provide current to the sensor are shown at the upper right of the sensor. The sensor is composed of two glass bottles, one of which (1603) is shown to the right of sensor 1600. The sensor 1600 is approximately 1¼ inches square as shown and about ½ inch tall as designated 1602. One sensor 1600 was filled with toluene and another sensor 1600 was filled with water. Each sensor 1600 contained magnetic nanoparticles of different concentrations under thirty nanometers in diameter.

Figure 17:
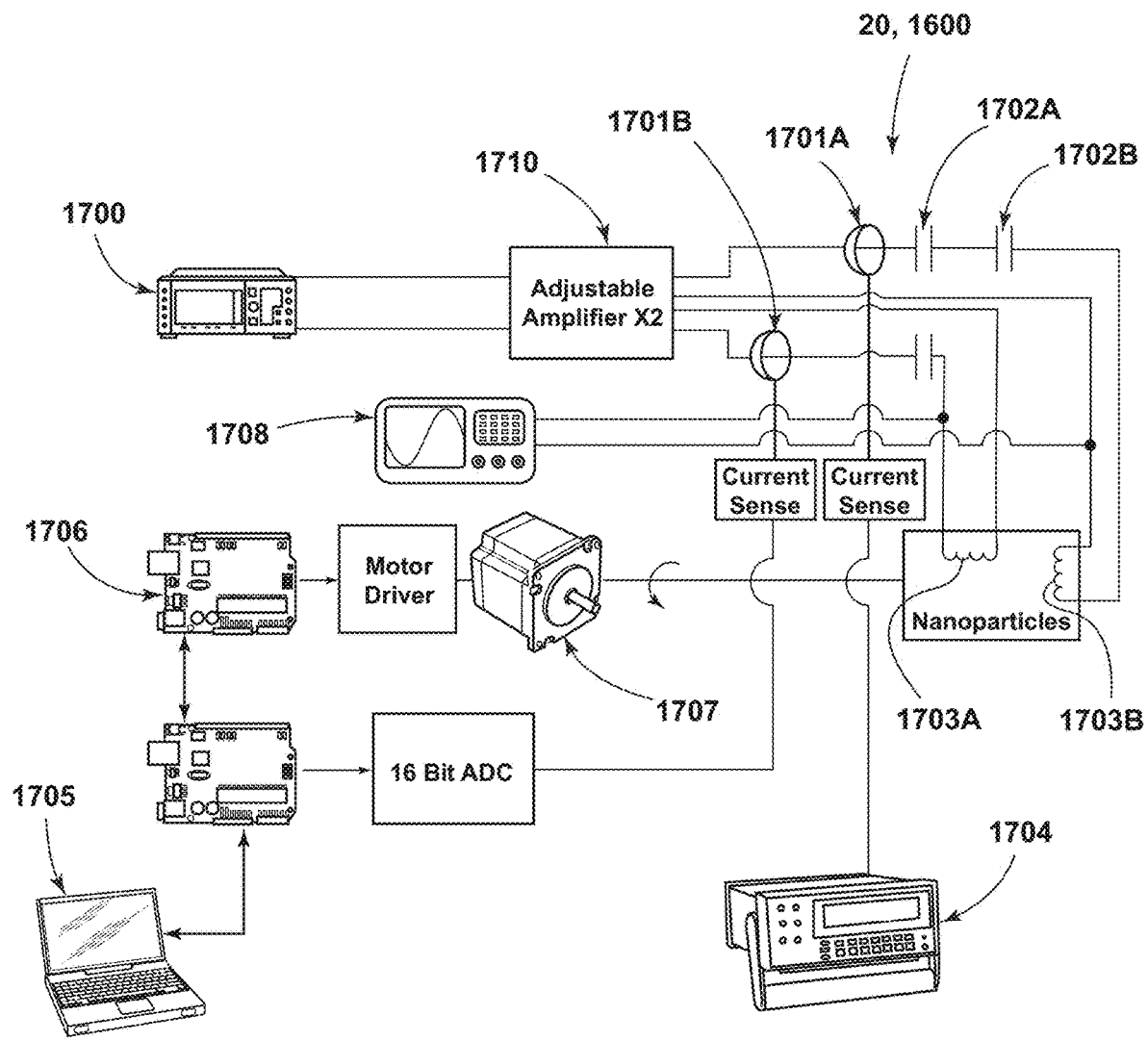
FIG. 17 is a schematic view showing a test setup wherein the sensor orientation is controlled by a stepper motor whereby the sensor is rotated through various known degrees as motion, held in place for a few seconds, and then returned to a "home" level position.

FIG. 17 is a schematic showing a test setup utilized to test a sensor 20, 1600. An AC signal of any frequency from 500 Hz to 1500 Hz is generated by a signal generator 1700. An adjustable amplifier 1710 provides electrical current to drive the magnetic nanoparticle sensor 20, 1600. Coils 1701A and 1701B are used to measure the amplitude of the electrical currents. The electrical currents may be adjusted to ensure that the currents are about the same magnitude. An oscilloscope 1708 is used to measure the phases of the electrical currents. The phases may be adjusted to ensure that the electrical currents are 90° out of phase. Capacitors 1702A, 1702B are connected to one output of the amplifier 1710, and a third capacitor 1702C is connected to the other output of amplifier 1710. This shifts the current phase angle. The sensor 20, 1600 includes embedded coils 1703A and 1703B. A precision voltmeter 1704 measures the RMS current from the coils 1703A and 1703B. A computer 1705 processes and/or stores the data from two data acquisition and motor controller circuit cards 1706. An electric motor 1707 is actuated to rotate (change the position) the nanoparticle sensor 20, 1600 for the experiment. An oscilloscope 1708 monitors the AC currents for generating the rotating magnetic field.

Figures 18A, 18B:
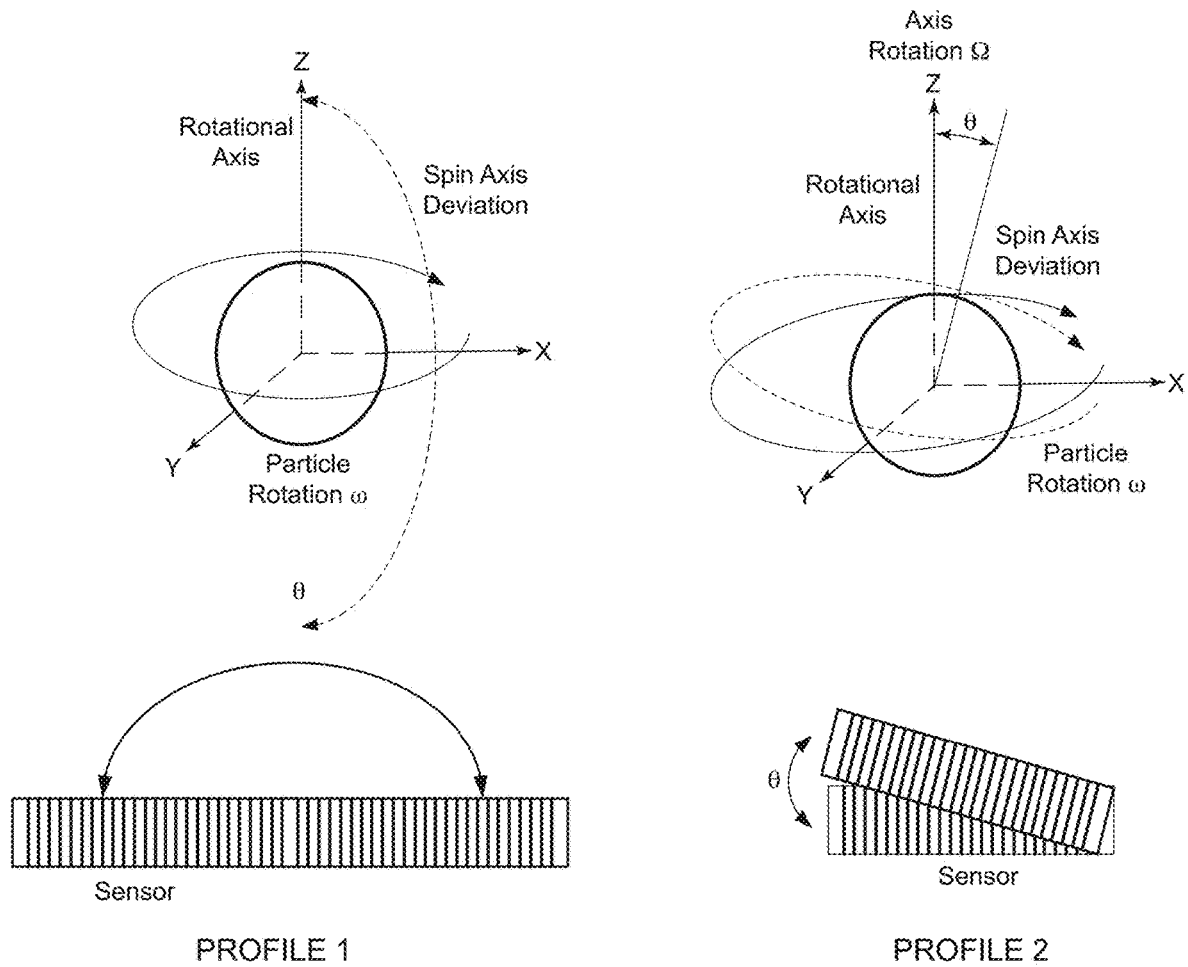
FIG. 18A is a schematic view showing a first profile used to test the sensor's ability to respond to continuous changes, and to test whether or not two different stable points that are 180° out of phase will result in similar electrical current drawn.
FIG. 18B shows a second profile used to test when a first (horizontal) position is stable, but wherein second (non-horizontal) position between 0° and 90° is unstable.

FIGS. 18A and 18B show two conditions. First, the orientation of the magnetic particle when the sensor is rotated 180° is shown in PROFILE 1 (FIG. 18A). Second, the orientation of a magnetic particle when the particle is rotated less than 90° is shown in PROFILE 2 (FIG. 18B). In PROFILE 1, both end points are stable (brief precession). PROFILE 2 results in longer sustained precession.

Figure 19:
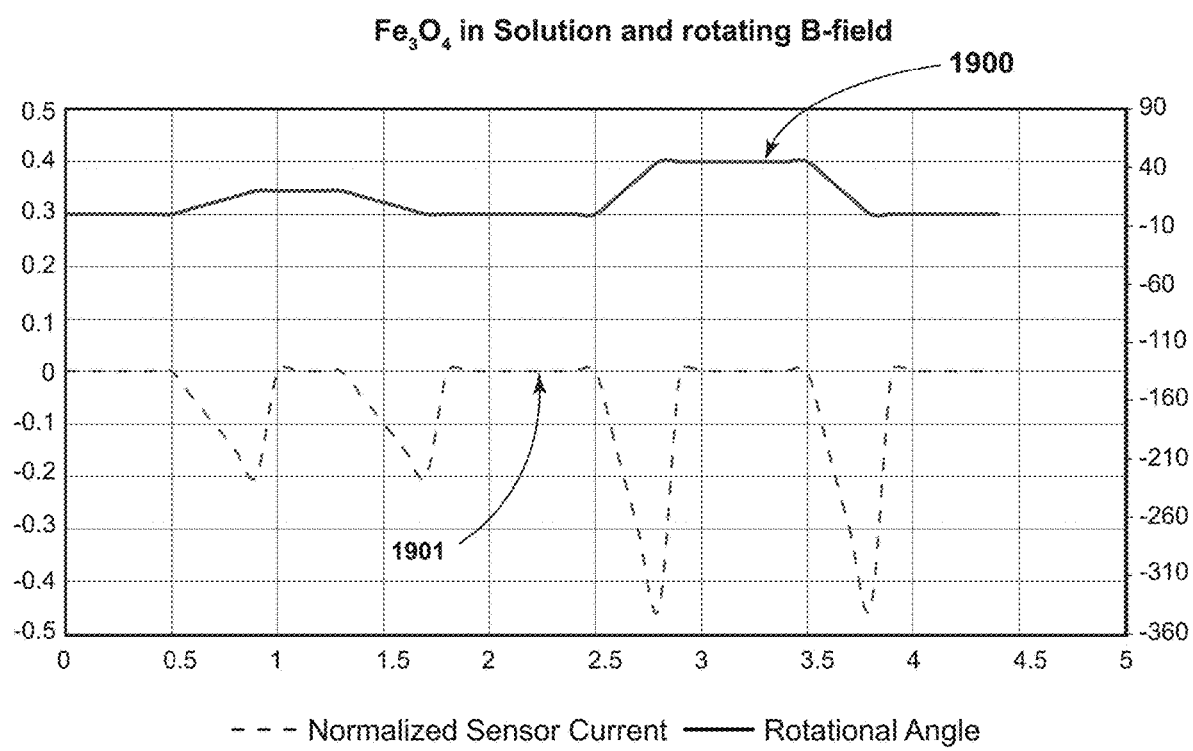
FIG. 19 is a graph showing theoretical results when the nanoparticle based sensor is rotated back and forth to 20° and 40° showing that the sensor cannot distinguish between clockwise and counterclockwise movement.

FIG. 19 is a graph showing theoretical results when rotating a sensor 20 from 0° to 20° and back and from 0° to 45° and back. Line 1900 represents the rotational angle of the sensor 20. The dotted line 1901 shows the change in relative current which is only evident during the transition. No permanent current displacement is expected if the magnetic field force is strong enough to overcome gravity, eliminating precession.

Figure 20:
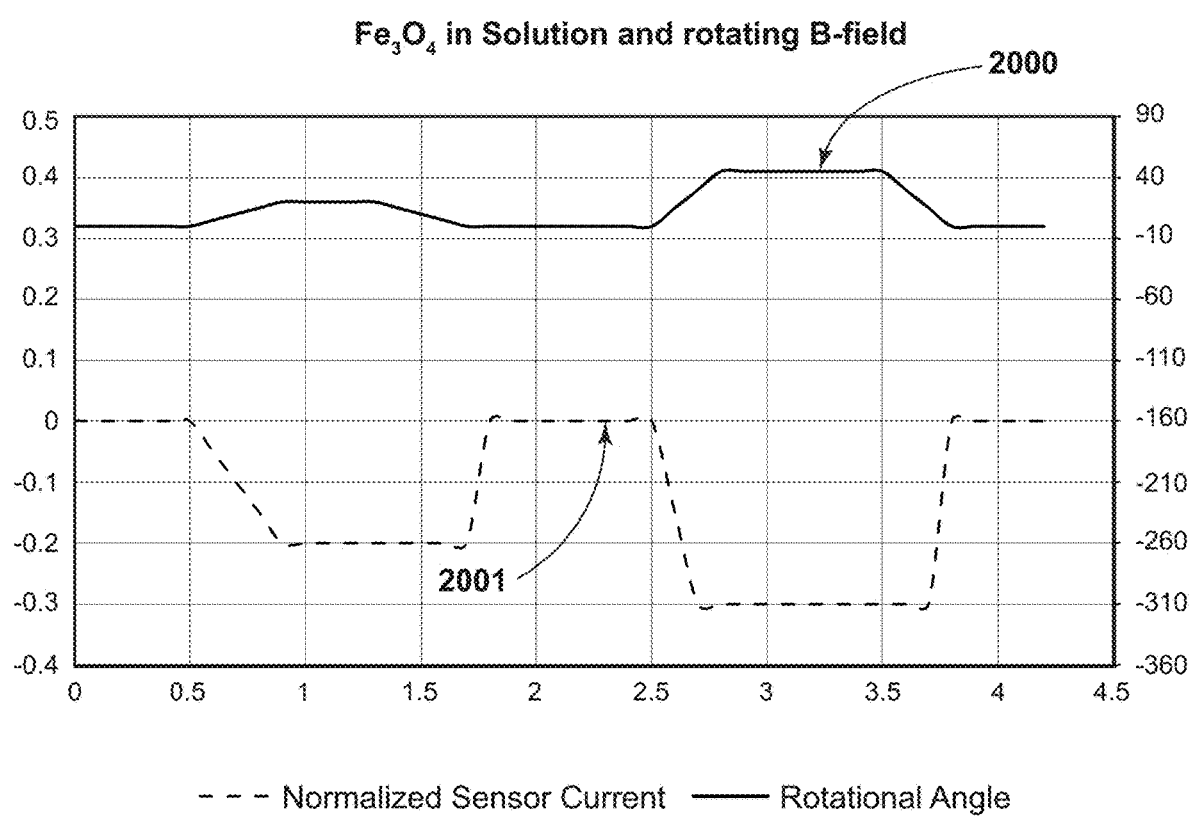
FIG. 20 is a graph showing theoretical results for the sensor if precession is maintained. The greater the angle change, the greater the output change in electrical current.

FIG. 20 is a graph showing theoretical results when rotating a sensor 20 from 0° to 20° and back and from 0° to 45° and back. The angle is shown by line 2000. The dotted lines 2001 shows the change in relative current which is only evident during the transition. Permanent current displacement is expected if the magnetic field force is not strong enough to overcome gravity, resulting in constant precession.

Figure 21:
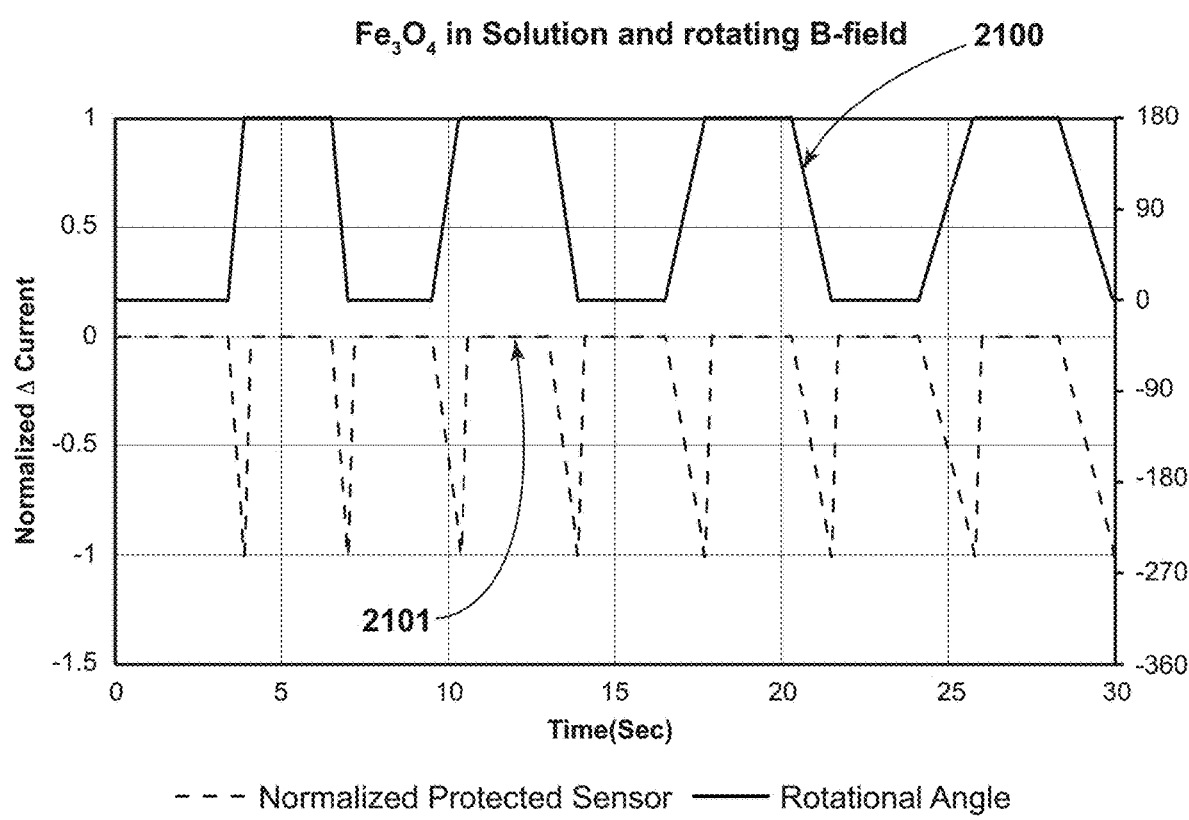
FIG. 21 is a graph showing the theoretical output of the sensor when the sensor is rotated a full 180° at varying rates assuming rapid recovery from precession.

FIG. 21 is a graph showing theoretical results when rotating sensor 20 back and forth 180° at different rates. The angle is shown by line 2100, and the change in current is shown by dashed line 2101. No permanent current displacement is expected if the magnetic field force is strong enough to overcome gravity, eliminating precession.

Figure 22:
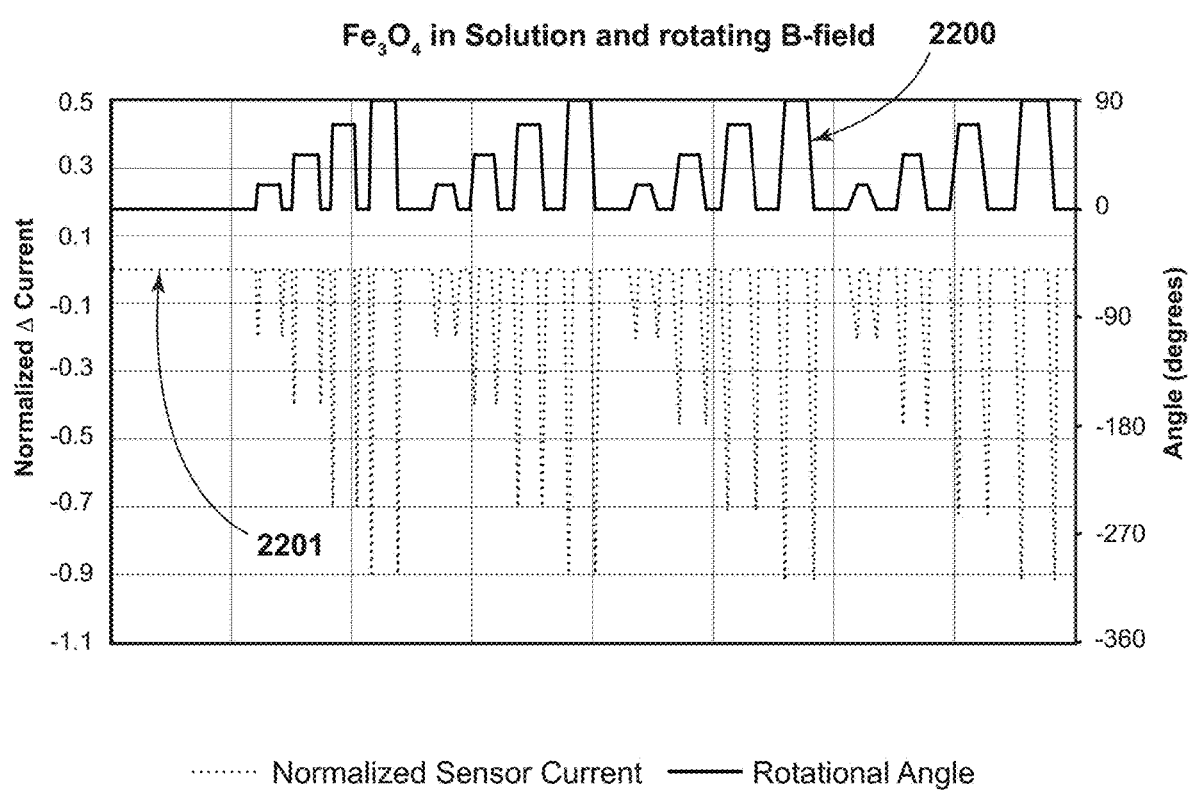
FIG. 22 is a graph showing the theoretical output of the sensor when the sensor is rotated varying angles from 20° to 180° at various rates.

FIG. 22 is a graph showing theoretical results when rotating the sensor 20 back at several different angles and at different rates. The angle is shown by line 2200. The change in current is shown by dashed line 2201. No permanent current displacement is expected if the magnetic field force is strong enough to overcome gravity, eliminating precession. Larger brief displacements are expected for larger angle changes. Longer displacements are expected for slower angle changes.

TABLE 1 shows the typical characteristics values and properties of nanoparticles in water and toluene solutions.

TABLE 1

Nanoparticle Properties in Water and Toluene Solutions

|  | Water solution | Toluene solution |
|---|---|---|
| Nanoparticle Mass m | $7.065 \times 10^{-17}$ g | $2.09 \times 10^{-17}$ g |
| Nanoparticle Radius r | $15 \times 10^{-7}$ cm | $10 \times 10^{-7}$ cm |
| Nanoparticle Volume V | $1.413 \times 10^{-17}$ cm$^3$ | $4.189 \times 10^{-18}$ cm$^3$ |
| Fluid Viscosity η | 1.002 cp | 0.590 cp |
| Angular velocity | 500 hz-1500 hz | 500 hz-1500 hz |
| Concentration | 5 mg/ml | 20% wt |
| Nanoparticles in sensor | $1.42 \times 10^{16}$ | $7.18 \times 10^{14}$ |

TABLE 2 shows the restrictions of torque due to viscosity of either water or toluene solution where the dynamic or absolute viscosity is assumed.

TABLE 2

Torque Restrictions Due to Viscosity

|  | Water Solution (@ 1500 Hz) | Toluene solution (@ 1500 Hz) |
|---|---|---|
| Precession | $8.00 \times 10^{-13}$ cp(cm$^3$)rad/sec | $1.40 \times 10^{-13}$ cp(cm$^3$)rad/sec |

A higher viscosity corresponds to a thicker, slower moving liquid (solution) that would present more "shearing" stress against an object in its path. This shearing stress creates more friction. More friction means more force, such that more torque is needed to rotate the nanoparticles. It will be understood that lower viscosity is normally preferred to minimize losses due to friction. An ideal sensor would contain free floating nanoparticles in a vacuum with no friction to oppose their motion. This setup would result in more of a true precession during a disturbance, instead of a spin-down as testing of water-based test sensor 1600 experienced. The nanoparticle is powered by Brownian motion.

TABLE 3 shows data for the nanoparticle solutions utilized in the prototype sensor 1600 (FIG. 16).

TABLE 3

| | | | | | Dynamic |
| | | Average | | Sigma Aldrich | Viscosity at |
| Sample | Solution | nanoparticle size | Density | Part number | 25° C. |
|---|---|---|---|---|---|
| 1 | Water | <30 nm average size <100 nm | 1.17 g/mL ± 0.1 g/mL at 25° C. | 720704-100G | 1.002 cP |
| 2 | Toluene | 20 nm average size (18-22 nm) | .865 g/mL at 25° C. | 700304-5ML | 0.590 cP |

Two readily available types of magnetic nanoparticles were used in the prototype sensor 1600. The significant differences between the samples included the type of fluid used for the solution and therefore the viscosity of the fluid, and the size of the nanoparticles. A first sample was toluene-based and the second was water-based. Both samples contained magnetite ($Fe_3O_4$) nanoparticles. The water-based sample contained nanoparticles that are about 33% larger on average than the toluene-based sample.

Figure 23:
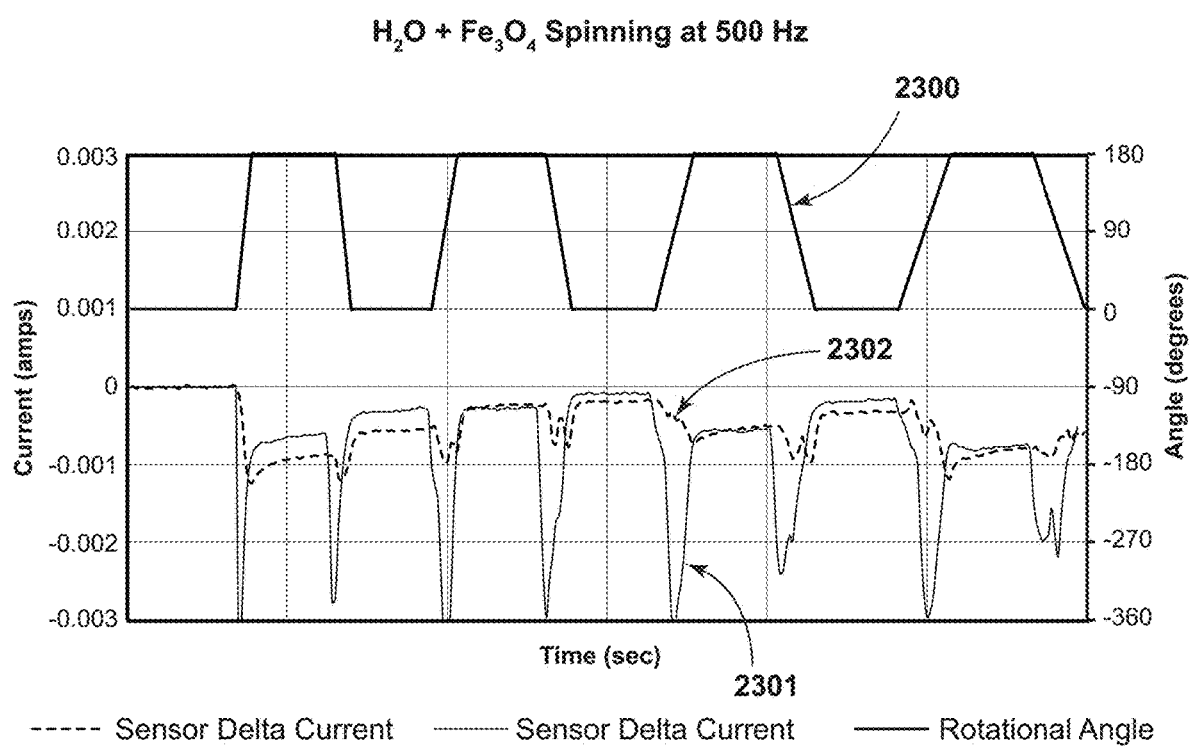
FIG. 23 is a graph showing actual changes (delta) of the electrical currents from both coils of as sensor that includes magnetic nanoparticles in solution with water when the sensor is rotated 180° at varying rates.

FIG. 23 is a graph showing actual (measured) results when rotating a water-based magnetic nanoparticle sensor 1600 back and forth 180° at different rates. The angle is shown by line 2300. As predicted, only temporary precession results, confirming that the magnetic field is strong enough in this test to overcome gravity. The line 2301 shows the results for one coil. The electrical current of the other coil is shown by dotted line 2302. The electrical current (line 2302) of the other coil is relatively unaffected by the orientation change because it is only sensitive to the alternate orientation (see, e.g. FIG. 15).

Figure 24:
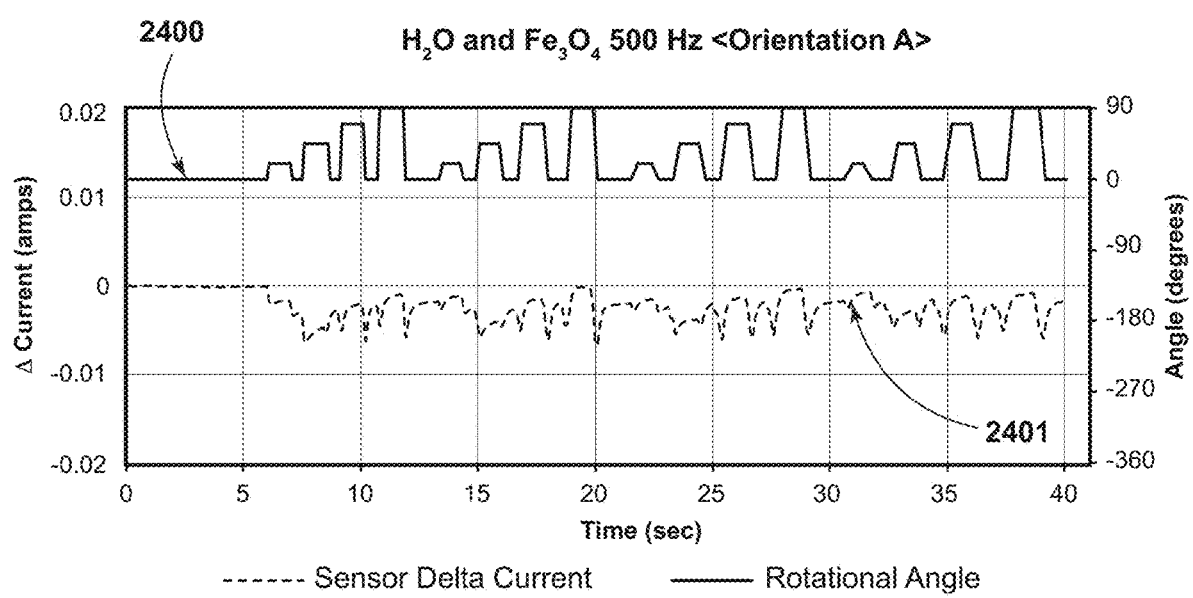
FIG. 24 is a graph showing the changes (delta) of the current output when the sensor is rotated at various angles and rates, wherein the sensor includes magnetic nanoparticles disposed in toluene. This plot shows a decreased sensitivity to solubility.

FIG. 24 is a graph showing the second orientation at different rotation angles and different rotation rates. The rotation angle is shown by line 2400. As predicted, this coil is relatively immune to rotations in this orientation 2401, confirming that sensor 1600 can sense rotations in two orientations/dimensions.

Figure 25:
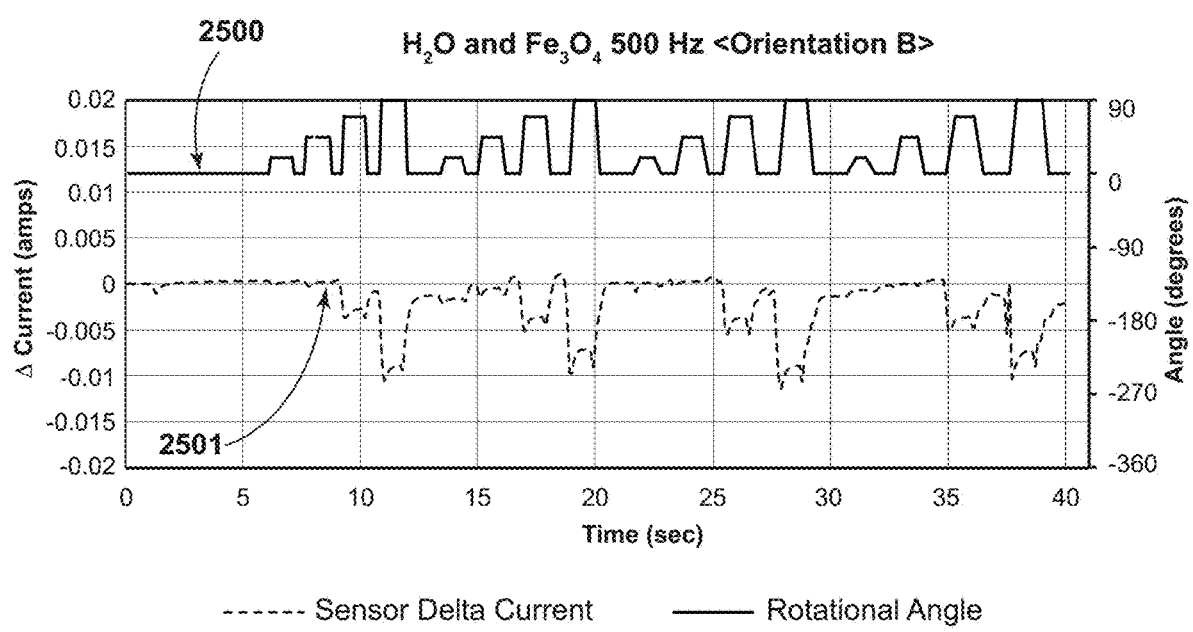
FIG. 25 is a graph showing the changes (delta) in the electrical current due to rotation of the sensor when the magnet nanoparticles are disposed in a solution of water. The sensor is more sensitive to rotation angles greater than 20°.

FIG. 25 is a graph showing actual (measured) results when rotating a prototype water-based magnetic nanoparticle sensor 1600 back and forth at several angles and at different rates in a first orientation. The angle is shown by line 2500, and the change in current is shown by the dashed line 2501. As predicted, only longer precessional effects result, confirming that the magnetic field is not strong enough in this test configuration to overcome gravity.

In general, testing has demonstrated that different frequencies and different drive currents can produce outcomes in which gravity is overcome, and outcomes in which gravity is not overcome.

Although the present disclosure has been described above by the use of specific embodiments, the present invention is not limited thereto and is deemed to cover all equivalents and obvious modifications of the described structure and process steps.

The term "gyroscope" is used herein to convey various concepts relating to the disclosed device. However, it will be understood that the present disclosure is not limited to a "gyroscope" in the conventional sense, but more broadly refers to devices and methods for sensing or determining one or more of rotational acceleration, velocity, position, and/or changes in these variables. Also, it will be understood that the term alternating current ("AC") as used herein is not limited to alternating sinusoidal currents, and AC could be virtually any electrical current that fluctuates, including, for example, square, rectangular, triangle, etc.

It is to be understood that variations and modifications can be made on the aforementioned structure without departing from the concepts of the present invention, and further it is to be understood that such concepts are intended to be covered by the following claims unless these claims by their language expressly state otherwise.

The invention claimed is:

1. A sensor comprising:
   a container;
   a liquid disposed in the container;
   a plurality of magnetic particles disposed in the liquid, the magnetic particles defining magnetic poles and moments of inertia;
   an electrical power source providing alternating electrical current;
   a plurality of conductive coils operably corrected to the electrical power source such that electrical current passing through the conductive coils generates a rotating magnetic field acting on the magnetic particles and causing the magnetic particles to rotate with the magnetic field whereby the particles define axes of rotation;
   and wherein angular movement of the coils causes angular movement of the magnetic field, thereby generating a force causing the orientations of the axes of rotation of the particles to change, thereby causing a change in the alternating current to the conductive coils that can be utilized to determine at least one of angular position, angular movement, and angular acceleration of the coils.

2. The sensor of claim 1, wherein:
   the magnetic particles comprise nanoparticles.

3. The sensor of claim 1, wherein:
   the container defines a cuboid rectangular inner cavity.

4. The sensor of claim 1, wherein:
   the plurality of coils comprises first and second coils disposed about first and second axis, respectively, and wherein the first and second axes are transverse relative to each other.

5. The sensor of claim 4, wherein:
   the first and second axes are orthogonal relative to each other.

6. The sensor of claim 4, wherein:
   the electrical power source provides first and second alternating currents to the first and second coils, respectively, and wherein the first and second alternating currents are 90° out of phase.

7. The sensor of claim 6, including:
   a current sensor configured to measure changes in the first and second alternating currents.

8. The sensor of claim 7, including:
   a processor operably connected to the current sensor, wherein the processor is configured to determine a magnitude of the angular movement of the coils utilizing measured changes in the first and second alternating currents.

9. The sensor of claim 8, including:
a display operably connected to the processor, wherein the processor is configured to cause the display to display information concerning the angular movement of the sensor.

10. A method of sensing angular movement, comprising:
providing a plurality of magnetic particles disposed in a liquid, the magnetic particles defining magnetic poles and moments of inertia;
generating a rotating magnetic field acting on the magnetic particles by causing an electrical current to pass through at least one conductive coil to cause the magnetic particles to rotate with the magnetic field to define axes of rotation;
determining a magnitude of an angular movement of the at least one conductive coil utilizing a change in the electrical current to the at least one conductive coil.

11. The method of claim 10, wherein:
the magnetic particles comprise nanoparticles.

12. The method of claim 10, wherein:
the liquid is disposed in a container having a cuboid rectangular inner cavity.

13. The method of claim 10, wherein:
the at least one coil comprises first and second coils disposed about first and second axes, respectively, and wherein the first and second axes are transverse relative to each other.

14. The method of claim 13, including:
orienting the first and second axes such that the axes are orthogonal relative to each other.

15. The method of claim 13, wherein:
the electrical power source provides first and second alternating currents to the first and second coils, respectively, and wherein the first and second alternating currents are 90° out of phase.

16. The method of claim 15, including:
utilizing a current sensor to measure changes in the first and second alternating currents.

17. The method of claim 16, including:
utilizing a processor that is operably connected to the current sensor to determine a magnitude of the angular movement of the coils utilizing measured changes in the first and second alternating currents.

18. The method of claim 17, including:
displaying information concerning the angular movement of the sensor utilizing a display that is operably connected to the processor.

* * * * *

UNITED STATES PATENT AND TRADEMARK OFFICE
CERTIFICATE OF CORRECTION

PATENT NO. : 10,830,589 B2
APPLICATION NO. : 16/258881
DATED : November 10, 2020
INVENTOR(S) : Brian G. Krug et al.

It is certified that error appears in the above-identified patent and that said Letters Patent is hereby corrected as shown below:

In the Specification

Column 9, Line 36:
"$\hat{B}y$" should be — $\hat{B}*y$ —

Column 9, Line 36:
"$\hat{M}y$" should be — $\hat{M}*y$ —

Column 10, Line 33:
"0" should be — $\theta$ —

Column 11, Line 47:
"1m" should be — Im —

Column 15, Line 66:
"$\pi$" should be — $\lambda$ —

Column 16, Line 17:
"=" should be — - —

Signed and Sealed this
Seventeenth Day of May, 2022

Katherine Kelly Vidal
*Director of the United States Patent and Trademark Office*